US009290837B2

(12) United States Patent
Noguchi et al.

(10) Patent No.: US 9,290,837 B2
(45) Date of Patent: Mar. 22, 2016

(54) METHOD OF FORMING ORGANIC POLYMER THIN FILM AND AN APPARATUS FOR FORMING THE ORGANIC POLYMER THIN FILM

(75) Inventors: Masumi Noguchi, Anjo (JP); Ken Momono, Chigasaki (JP); Hagane Irikura, Tsukuba (JP)

(73) Assignees: Kojima Press Industry Co., Ltd., Toyota-Shi (JP); ULVAC, INC., Chigasaki-Shi (JP)

( * ) Notice: Subject to any disclaimer, the term of this patent is extended or adjusted under 35 U.S.C. 154(b) by 425 days.

(21) Appl. No.: 12/903,431

(22) Filed: Oct. 13, 2010

(65) Prior Publication Data

US 2011/0091650 A1     Apr. 21, 2011

(30) Foreign Application Priority Data

Oct. 15, 2009   (JP) .................................. 2009-238179

(51) Int. Cl.
*C23C 14/12*   (2006.01)
*C23C 14/24*   (2006.01)

(52) U.S. Cl.
CPC ............... *C23C 14/12* (2013.01); *C23C 14/246* (2013.01)

(58) Field of Classification Search
CPC .............................. C23C 14/24; C23C 14/246
See application file for complete search history.

(56) References Cited

U.S. PATENT DOCUMENTS 4,235,829 A * 11/1980 Partus ......................... 261/121.1
5,480,488 A * 1/1996 Bittner et al. ................. 118/667
6,161,398 A * 12/2000 Partus .............................. 65/379
7,994,716 B2 * 8/2011 Takahashi ...................... 313/512
2004/0011288 A1 * 1/2004 Affinito ........................... 118/718
2007/0292610 A1 * 12/2007 Abiko et al. ............... 427/248.1
2010/0015324 A1    1/2010 Negishi

FOREIGN PATENT DOCUMENTS

| EP | 1 493 837 A1 | 1/2005 |
| EP | 2 025 774 A1 | 2/2009 |
| JP | 61-078463 A1 | 4/1986 |
| JP | 04-080235 A1 | 3/1992 |
| JP | 05-171415 A1 | 7/1993 |
| JP | 07-026023 A1 | 1/1995 |
| JP | 11-172418 A1 | 6/1999 |
| JP | 2002-275619 A1 | 9/2002 |
| JP | 2002-283490 A1 | 10/2002 |
| WO | 2005/109963 A1 | 11/2005 |
| WO | WO 2007055168 A1 * | 5/2007 |

OTHER PUBLICATIONS

Japanese Office Action dated Jul. 23, 2013, for JP 2009-238179.

* cited by examiner

*Primary Examiner* — Joel Horning
(74) *Attorney, Agent, or Firm* — Burr & Brown, PLLC

(57) ABSTRACT

A technique for forming an organic polymer thin film on a surface of a substrate with high film formation efficiency and excellent reproducibility and stability is provided. When a vacuum deposition polymerization for forming an organic polymer thin film is performed on a surface of a substrate repeatedly, in which a plurality of kinds of monomers evaporated in a plurality of evaporation source containers in vacuum state are introduced into a deposition chamber in a vacuum state and polymerized on a surface of the substrate arranged in the deposition chamber, each of the monomers in a liquid form is present in the evaporation source containers in a constant amount every time, at the beginning of the evaporation operation of monomers.

5 Claims, 14 Drawing Sheets

METHOD OF FORMING ORGANIC POLYMER THIN FILM AND AN APPARATUS FOR FORMING THE ORGANIC POLYMER THIN FILM

The present application is based on Japanese Patent Application No. 2009-238179 filed on Oct. 15, 2009, the contents of which are incorporated herein by reference.

BACKGROUND OF THE INVENTION

1. Field of the Invention

The present invention relates to a method of forming an organic polymer thin film and an apparatus for forming the organic polymer thin film. More particularly, the present invention relates to a method of advantageously forming a thin film of an organic polymer on a surface of a substrate by vacuum deposition polymerization, and an apparatus for effectively performing the method of forming a thin film of an organic polymer.

2. Description Of Related Art

Conventionally, as one kind of methods for forming an organic polymer thin film (synthetic resin thin film), there is known a vacuum deposition polymerization. In this polymerization, a plurality of kinds of monomers (raw materials) are evaporated in vacuum and polymerized on a surface of a substrate, thereby forming an organic polymer thin film on the surface of the substrate (see, JP-A-61-78463, for example).

In the above method of forming an organic polymer thin film by vacuum deposition polymerization, a special apparatus for the method is generally used. The apparatus for forming an organic polymer thin film generally includes a deposition chamber in which a substrate is disposed, and a plurality of evaporation source containers. Each of the evaporation source containers contains a separate kind of monomer and introduces the monomer into the deposition chamber by evaporating the monomer under vacuum pressure. In the apparatus, the monomers introduced into the deposition chamber in a vacuum state after being evaporated in respective evaporation source containers are polymerized on a surface of the substrate disposed in the deposition chamber. Therefore, an organic polymer thin film formed of the polymer of the monomers can be formed on the surface of the substrate.

As the conventional apparatus for forming an organic polymer thin film, there is known a batch type apparatus in which the above vacuum deposition polymerization is repeatedly operated in the same deposition chamber, thereby forming an organic polymer thin film on a surface of a plurality of substrates, which is provided in the deposition chamber one after another. Further, there is known a continuous type apparatus in which the vacuum deposition polymerization is continuously operated while a substrate is unwound from a roll of the substrate which is disposed in a deposition chamber, thereby forming an organic polymer thin film on a surface of the substrate unwound from the roll.

When an organic polymer thin film, such as a polyimide film, an aromatic polyurea film or an aromatic polyamide film, which is formed of a combination of high reactive (small activation energy for the reaction) monomers, is formed on a surface of a substrate, a monomer proportion on the surface of the substrate can be stoichiometric proportion only by opening and closing a shutter which is conventionally used for a vacuum disposition and provided between each evaporation source container and a substrate in a deposition chamber. Accordingly, the organic polymer thin film formed on the surface of the substrate can have a desired composition, and a thickness of the film can be easily controlled. As a result, when a combination of high reactive monomers is used, an organic polymer thin film can be always stably formed on a surface of a substrate with a constant composition and thickness both in the vacuum deposition polymerization operated repeatedly by using a batch-type apparatus and in the vacuum deposition polymerization operated continuously by using a continuous type apparatus.

On the other hand, in the formation of an organic polymer thin film, such as an aliphatic polyurea film, an aliphatic polyamide film, a polyester film or a polyurethane film, which is formed of a combination of low reactive (big activation energy for the reaction) monomers, a monomer proportion on the surface of the substrate cannot be easily to be stoichiometric proportion by only opening and closing the shutter. Accordingly, it is difficult to control the composition and thickness of the organic polymer thin film that is obtained by a combination of low reactive monomers. Therefore, it is extremely difficult to form an organic polymer thin film on a surface of a substrate with excellent reproducibility or repeatability both in a vacuum deposition polymerization operated repeatedly by using a batch-type apparatus and in a vacuum deposition polymerization operated continuously by using a continuous type apparatus.

Under such situation, JP-A-5-171415 discloses an apparatus for forming an organic polymer thin film in which each of evaporation source containers arranged in a deposition chamber includes an open/close device at an opening portion thereof and a vacuum exhaust device. JP-A-5-171415 further discloses that, by using the apparatus, the amount of evaporated monomer released from each evaporation source container can be separately controlled, and degree of vacuum in each evaporation source container at the time of closing the open/close device can be made equal with the degree of the vacuum during the film formation (deposition), thereby performing film formation with excellent reproducibility and stability. However, there is no difference in pressure in the evaporation source containers and in the deposition chamber of such apparatus. Accordingly, evaporation amount of each monomer is inevitably small and a speed of film formation (amount of film formation per unit time) is reduced, which results in a problem of reduction in film formation efficiency.

Further, JP-A-7-26023 discloses an apparatus that is adapted to pass carrier gas through respective evaporation source containers and introduce the carrier gas including the evaporated monomer into a deposition chamber. JP-A-7-26023 further discloses that, by adjustment of flow rate of carrier gas, introduction amount of each monomer into the deposition chamber can be controlled with high degree of accuracy, so that each monomer can be introduced into the deposition chamber so as to be stoichiometric proportion. However, in such an apparatus, the monomer is introduced into the deposition chamber with carrier gas, so that, compared to the case in which only the monomer is introduced into the deposition chamber, an amount of the monomer in the deposition chamber is inevitably made smaller. As a result, in such an apparatus, defects such as reduction in film formation efficiency cannot be avoided.

Furthermore, JP-A-2002-275619 discloses an apparatus including a pulse valve in each evaporation source container, which can be opened and closed at arbitrary time intervals. JP-A-2002-275619 further discloses that, by using the apparatus, introduction time of each monomer into the deposition chamber can be suitably determined, so that the amount of each monomer introduced into the deposition chamber can be separately controlled. However, in such an apparatus, evaporation amount of the monomers per unit time is changed by reduction in the amount of monomer in each evaporation source container, so that open/close cycle of the open/close device should be changed depending on the change of the evaporation amount of the monomer. In addition, the changes of controlling condition largely affect a thickness and reproducibility of quality of an organic polymer thin film obtained by a combination of the low reactive monomers, so that, in this conventional apparatus, it was extremely difficult to always obtain an organic polymer thin film having a constant composition and thickness, with excellent reproducibility.

SUMMARY OF THE INVENTION

The present invention has been made in the light of the situations described above, and an object of the invention is to provide a method of forming an organic polymer thin film, which exhibits high film formation efficiency and forms an organic polymer thin, film of the same quality having a constant composition and thickness with excellent reproducibility and stability regardless of the combination of monomers. It is another object of the invention to provide an apparatus for forming an organic polymer thin film that advantageously performs the above method.

To attain the aforementioned objects, or solve the problems understood from the description throughout the present specification and drawings, the present invention may be preferably embodied according to various aspects which will be described below. Each aspect described below may be employed in any combination. It is to be understood that the aspects and technical features of the present invention are not limited to those described below, and can be recognized based on the inventive concept disclosed in the whole specification and the drawings.

(1) A method of forming an organic polymer thin film, including the steps of: performing an evaporation operation of a plurality of kinds of monomers in a plurality of evaporation source containers in vacuum state; and introducing the evaporated plurality of kinds of monomers into a deposition chamber in a vacuum state so as to be polymerized on a surface of at least one substrate disposed in the deposition chamber, thereby performing a vacuum deposition polymerization which is a forming operation of an organic polymer thin film on the surface of the at least one substrate, where the plurality of kinds of monomers are present in the plurality of evaporation source containers each in a constant amount in a liquid form at the evaporation operation of the monomers.

(2) The method of forming an organic polymer thin film according to the above aspect (1), where the at least one substrate comprises a plurality of substrates and the vacuum deposition polymerization is repeatedly performed to form the organic polymer thin film on the surface of each of the plurality of substrates that is disposed in the deposition chamber in turn, and in the repeated vacuum deposition polymerization, the plurality of kinds of monomers are present in the plurality of evaporation source containers each in a constant amount in a liquid form every time at beginning of the evaporation operation of the monomers.

(3) The method of forming an organic polymer thin film according to the above aspect (2), where, in the repeated vacuum deposition polymerization, a required amount of each of the plurality of kinds of monomers in a liquid form is supplied into each of the plurality of evaporation source containers, every time, before the beginning of the evaporation operation, thereby allowing the plurality of kinds of monomers to be present in the plurality of evaporation source containers each in a constant amount in a liquid form at the beginning of the evaporation operation of the monomers.

(4) The method of forming an organic polymer thin film according to the above aspect (2), where, in the repeated vacuum deposition polymerization, a constant amount of each of the monomers in a liquid form is always allowed to be present in each of the plurality of evaporation source containers every time from beginning of the evaporation operation of the monomers to end of the forming operation of the organic polymer thin film on a surface of the plurality of substrates.

(5) The method of forming an organic polymer thin film according to the above aspect (4), where each of the plurality of kinds of monomers is intermittently or continuously supplied into each of the plurality of evaporation source containers in a liquid form, every time from the beginning of the evaporation operation of the monomers to end of the forming operation of the organic polymer thin film on a surface of the plurality of substrates, by an amount equal to the amount that is reduced due to the evaporation, thereby allowing the plurality of kinds of monomers in a liquid form to be present in the plurality of evaporation source containers always in a constant amount.

(6) The method of forming an organic polymer thin film according to the above aspect (1), where the organic polymer thin film is continuously formed on the surface of the at least one substrate by performing the vacuum deposition polymerization while the substrate is unwound from a roll of substrate disposed in the deposition chamber, and the plurality of kinds of monomers in liquid form are present in the plurality of evaporation source containers always in a constant amount from beginning to end of the vacuum deposition polymerization.

(7) The method of forming an organic polymer thin film according to the above aspect (6), where each of the plurality of kinds of monomers is intermittently or continuously supplied into each of the plurality of evaporation source containers in a liquid form by an amount equal to the amount that is reduced due to the evaporation, from the beginning to end of the vacuum deposition polymerization, thereby allowing the plurality of kinds of monomers to be present in the plurality of evaporation source containers each in a liquid form always in a constant amount.

(8) The method of forming an organic polymer thin film according to any one of the above aspects (1) to (7), the plurality of kinds of monomers are aliphatic diisocyanate and aliphatic diamine.

(9) The method of forming an organic polymer thin film according to any one of the above aspects (1) to (7), where the organic polymer thin film is any one of an aliphatic polyurea film, an aliphatic polyamide film, a polyester film, and a polyurethane film.

(10) An apparatus for forming an organic polymer thin film, an apparatus for forming an organic polymer thin film, comprising: a deposition chamber in which at least one substrate is disposed; and a plurality of evaporation source containers containing a plurality of kinds of monomers, the plurality of evaporation source containers being arranged to evaporate the plurality of kinds of monomers, while insides thereof being in vacuum state, so that the evaporated monomers are introduced into the deposition chamber in a vacuum state, the apparatus being arranged to polymerize the plurality of kinds of monomers evaporated in the plurality of evaporation source containers, on a surface of the at least one substrate disposed in the deposition chamber, thereby performing a vacuum deposition polymerization which forms an organic polymer thin film on the surface of the at least one substrate, where a plurality of supply mechanisms are provided for supplying the plurality of kinds of monomers in liquid form into the plurality of evaporation source containers, thereby allowing the plurality of monomers to be present in the plurality of evaporation source containers each in a constant amount in a liquid form at the evaporation operation of the monomers.

(11) The apparatus for forming an organic polymer thin film according to the above aspect (10), where the at least one substrate comprises a plurality of substrates and the deposition chamber is arranged to contain each of the plurality of substrates in turn so as to form the organic polymer thin film on the surface of each of the plurality of substrates disposed in the deposition chamber by repeatedly performing the vacuum deposition polymerization, and in the repeated vacuum deposition polymerization, the plurality of supply mechanisms are arranged to allow the plurality of kinds of monomers to be present in the plurality of evaporation source containers in a constant amount every time at beginning of the vacuum deposition polymerization.

(12) The apparatus for forming an organic polymer thin film according to the above aspect (11), where each of the plurality of supply mechanisms comprises a storage tank having a pressure above an atmospheric pressure and containing one of the plurality of kinds of monomers in a liquid form, a communication passage communicating the storage tank with the evaporation source container, and a first open/close mechanism provided on the communication passage, whereby, by opening the first open/close mechanism while the evaporation source container is in a vacuum state, the monomer contained in the storage tank being automatically suctioned into the evaporation source container through the communication passage by an amount equal to the amount used in one vacuum deposition polymerization operation, based on the difference between the pressure in the evaporation source container and the atmospheric pressure.

(13) The apparatus for forming an organic polymer thin film according to the above aspect (10), where the deposition chamber is arranged to contain a roll of substrate, thereby continuously forming the organic polymer thin film on the surface of the substrate unwound from the roll of substrate disposed in the deposition chamber, by performing the vacuum deposition polymerization while the substrate is unwound from the roll of substrate, and the plurality of supply mechanisms are arranged to allow the plurality of monomers to be present in the plurality of evaporation source containers each in a constant amount in a liquid form from the beginning to end of the vacuum deposition polymerization.

(14) The apparatus for forming an organic polymer thin film according to any one of the above aspects (10) to (13), where each of the plurality of evaporation source containers comprises: a liquid-storage chamber, the liquid-storage chamber being arranged to contain one of the plurality of kinds of monomers in a liquid form and evaporate the one of the plurality of kinds of monomers contained therein; and a vapor-storage chamber, the vapor-storage chamber being arranged to contain the monomer evaporated in the liquid-storage chamber and being connected to the liquid-storage chamber via a second open/close mechanism.

(15) The apparatus for forming an organic polymer thin film according to the above aspect (14), where the vapor-storage chamber of each of the plurality of evaporation source containers and the deposition chamber are connected via a control valve that is opened and closed such that the pressure in the deposition chamber becomes a predetermined value, the monomer evaporated in the evaporation source container being introduced into the deposition chamber by opening the control valve.

When the vacuum deposition polymerization is repeatedly performed, in the method of forming an organic polymer thin film according to the present invention, the amount of the monomer or raw material present in the evaporation source container, in a liquid form, at the beginning of the evaporation operation of the monomer or raw material is the same every time. Therefore, in the repeated vacuum vapor deposition operation, the evaporation amount of each of the monomers in one operation can always be the same without a special control. Further, when the vacuum vapor deposition process is continuously performed, in the method of forming an organic polymer thin film according to the present invention, the amount of the monomer present in the evaporation source container, in a liquid form, is constant from beginning to end of the vacuum deposition polymerization. Accordingly, also in this continuous vacuum deposition polymerization, the evaporation amount of each of the monomers per unit time during the film formation can be always the same, without a special control.

Thus, in the present method, the amount of the evaporated monomer introduced into the deposition chamber can always be controlled under a constant condition. Accordingly, for example, even if low reactive monomers that have different retention time on a surface of a substrate is used in a combination, the monomers can be introduced regularly and stably into the deposition chamber in the required amount. Therefore, the raw material (monomers) ratio on a surface of a substrate can readily and surely be stoichiometric proportion.

As a result, regardless of the kinds (combination) of the monomers to be used, an organic polymer thin film having a desired composition and a constant thickness can be advantageously formed in both of the repeated vacuum deposition polymerization and in the continuous vacuum deposition polymerization.

In the present method, carrier gas or the like is not employed to introduce a predetermined amount of monomer into the deposition chamber, and difference in the pressure between the evaporation source container and the deposition chamber is not made small. Thus, the predetermined amount of monomer can be introduced into the deposition chamber extremely effectively.

Thus, according to the method of forming an organic polymer thin film of the present invention, high film formation efficiency is advantageously exhibited. Further, regardless of the kinds of monomers, organic polymer thin films of equal quality having a predetermined composition and thickness always can be stably formed on surfaces of substrates with excellent reproducibility.

In addition, the apparatus for forming an organic polymer thin film according to the present invention can advantageously perform the above-described method. Thus, the same advantages and effects obtained in the method of forming an organic polymer thin film according to the present invention can also be advantageously obtained in the apparatus according to the present invention.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF THE INVENTION

To further clarify the present invention, there will be described a typical embodiment of the invention in detail with reference to the accompanying drawings.

Figure 1:
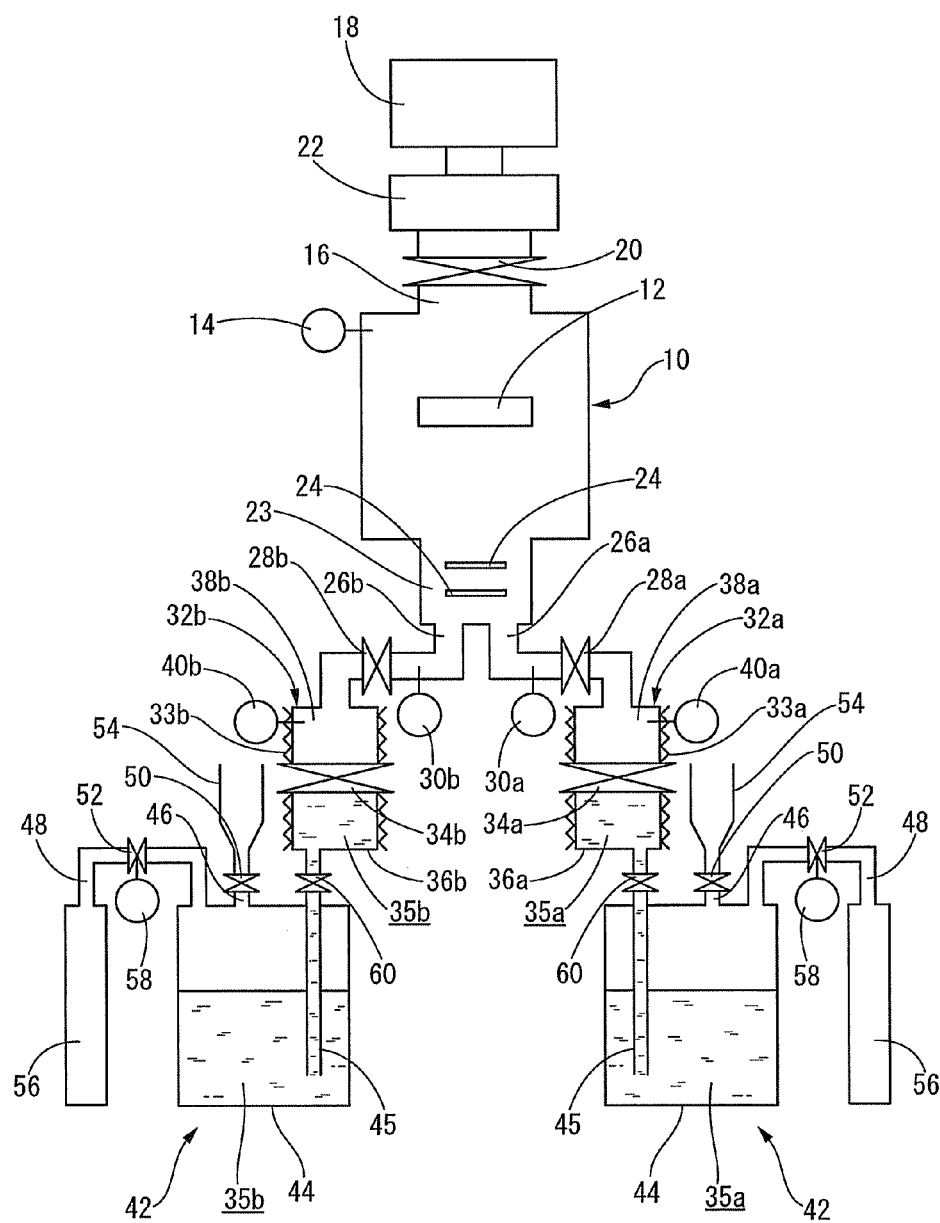
FIG. 1 is an explanatory view showing one example of an apparatus for forming an organic polymer thin film, which has a structure according to the present invention.

Initially, FIG. 1 schematically shows an example of an apparatus for forming an organic polymer thin film which has a structure according to the present invention. As apparent from FIG. 1, the apparatus for forming an organic polymer thin film according to the present invention includes a deposition chamber 10. Like the conventional apparatus, this deposition chamber 10 is constituted by a pressure tight container which can be hermetically sealed, and has an opening (not shown) which can be covered by a cover (not shown). Through the opening, a substrate 12 having a plate shape is placed in the deposition chamber 10 or taken out from the deposition chamber 10. That is, a plurality of substrates 12 can be taken from and in the deposition chamber 10 one after another so as to be disposed in the deposition chamber 10 in turn.

The deposition chamber 10 includes a deposition chamber pressure sensor 14 which detects an internal pressure of the deposition chamber 10. Further, an exhaust pipe 16 is connected to a side wall of the deposition chamber 10. The exhaust pipe 16 is connected to an electrical vacuum pump 18 at its end, and provided with a pressure control valve 20 for deposition chamber 10 at its middle portion. All of the deposition chamber pressure sensor 14, the vacuum pump 18, and the pressure control valve 20, are electrically connected to a controller, which is not shown.

Then, the deposition chamber 10 in which the substrate 12 is disposed is made to be in a vacuum state or under reduced pressure by operating the vacuum pump 18 while the pressure control valve 20 is opened. At that time, the pressure control valve 20 is opened and closed under control by the controller such that detected value by the deposition chamber pressure sensor 14 becomes a predetermined setting value (target value). Therefore, the internal pressure (degree of vacuum) of the deposition chamber 10 is controlled.

Further, a trap device 22 is provided between the pressure control valve 20 and the vacuum pump 18, which are provided on the exhaust pipe 16. This trap device 22 has a conventional structure and can trap, for example, moisture in the atmosphere in the deposition chamber 10, moisture generated in the film forming operation performed by the vacuum deposition polymerization, which will be described later, and excess raw material (monomer) that is left in the film forming operation.

Further, a mixing chamber 23 having a small capacity is provided so as to communicate with the deposition chamber 10 at the side of the deposition chamber 10 opposite to the side connected to the exhaust pipe 16. In the mixing chamber 23, two diffuser panels 24, 24 are disposed so as to be opposed to the substrate 12, which is disposed in the deposition chamber 10, with a predetermined distance therebetween. To the mixing chamber 23, two monomer inlet pipes 26a, 26b are connected. The monomer inlet pipes 26a, 26b are arranged so as to open toward surfaces of the two diffuser panels 24, 24 which are not opposed to the substrate 12 provided in the deposition chamber 23.

In the middle portion of the monomer inlet pipes 26a, 26b in an extending direction thereof, monomer inlet-side pressure control valves 28a, 28b are provided, respectively. Further, inlet-side pressure sensors 30a, 30b for detecting respective internal pressures in portions of the monomer inlet pipes 26a, 26b are each provided at the portion of the monomer inlet pipes 26a, 26b that is closer to the connecting position to the deposition chamber 10 than each of the monomer inlet-side pressure control valves 28a, 28b is. The monomer inlet-side pressure control valves 28a, 28b and the inlet-side pressure sensors 30a, 30b are electrically connected to a controller, which is not shown.

At end portions of the monomer inlet pipes 26a, 26b, a first evaporation source container 32a and a second evaporation source container 32b are connected, respectively. The first and second evaporation source containers 32a, 32b have the same structure. Specifically, both of the first and second evaporation source containers 32a, 32b are constituted by a pressure tight container which is hermetically sealed and extends in a vertical direction. Further, on an outer periphery of the first and second evaporation source containers 32a, 32b, heaters 33a, 33b are provided for heating spaces inside the first and second evaporation source containers 32a, 32b, respectively.

In the first and second evaporation source containers 32a, 32b, at a middle portion in a vertical direction thereof, gate valves 34a, 34b are respectively provided as second open/close mechanism, thereby partitioning each of the first and second evaporation source containers 32a, 32b into an upper portion and a lower portion. Then, by opening the gate valves 34a, 34b, the upper portion and the lower portion can be communicated with each other, and by closing the gate valves 34a, 34b, the upper portion and the lower portion can be disconnected so as not to be communicated with each other.

Figure 3:
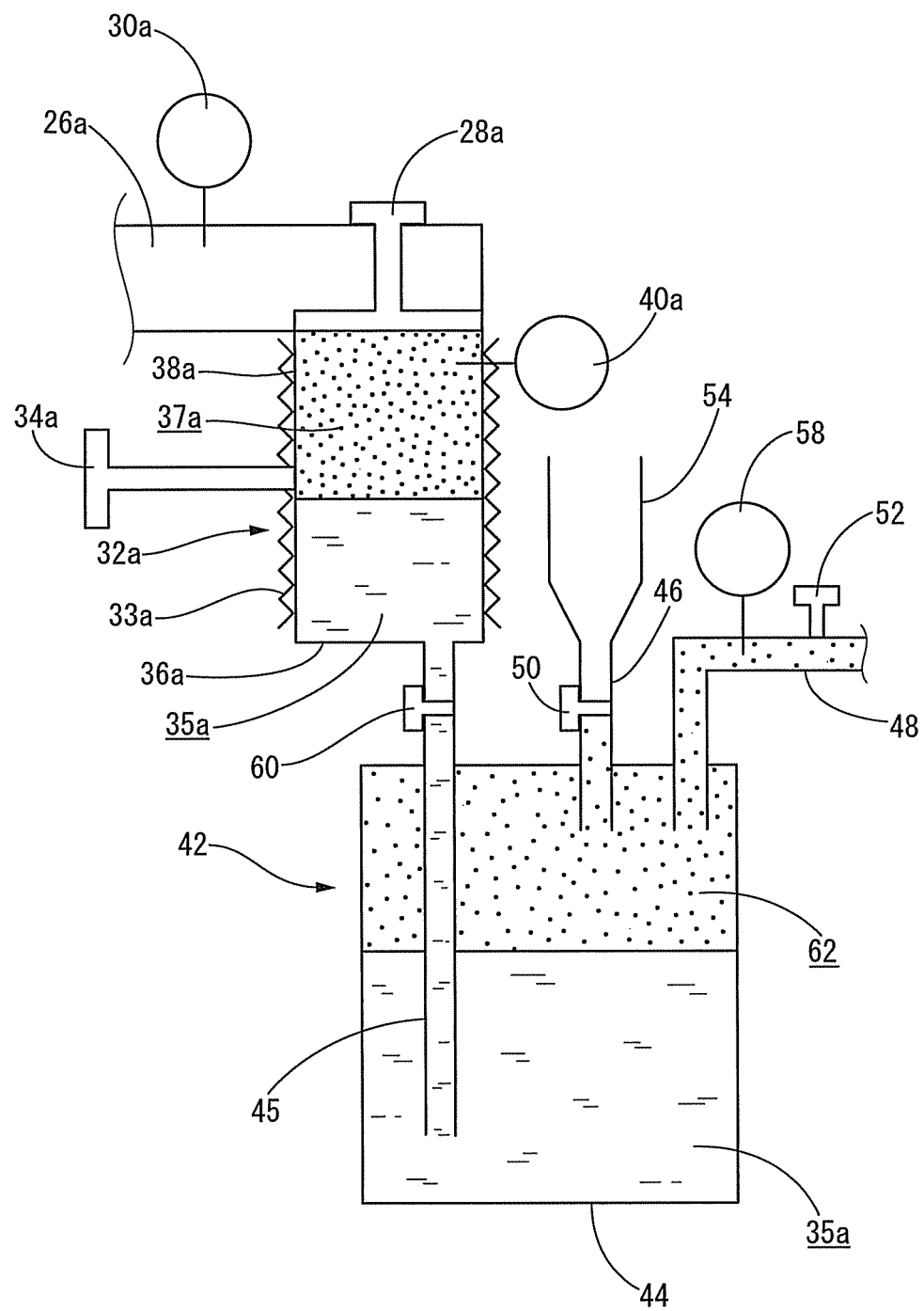
FIG. 3 is an explanatory view showing a step subsequent to the step in FIG. 2, in which monomer is heated and evaporated in the evaporation source container.

Here, the lower portion of the first evaporation source container 32a is made as a first liquid-storage chamber 36a for monomer liquid that contains a first monomer liquid 35a, which is a monomer in a liquid form, and the upper portion thereof is made as a first vapor-storage chamber 38a for monomer vapor that contains first monomer vapor 37a, which is the evaporated first monomer liquid 35a (see FIG. 3). Further, like the first evaporation source container 32a, the lower portion of the second evaporation source container 32b is made as a second liquid-storage chamber 36b for monomer liquid that contains a second monomer liquid 35b which is a monomer in a liquid form and different from the monomer contained in the first evaporation source container 32a. Further, the upper portion thereof is made as a second vapor-storage chamber 38b for monomer vapor that, contains a second monomer vapor 37b, which is the evaporated second monomer liquid 35b.

Each of the first and second liquid-storage chambers 36a, 36b and the first and second vapor-storage chambers 38a, 38b has a volume which can at least contain each of the first and second monomer liquids 35a, 35b and the first and second monomer vapors 37a, 37b in an amount that is needed to sufficiently form an organic polymer thin film on a surface of the substrate 12 by one vacuum deposition polymerization, which will be described later. The upper limit of volumes of the chambers 36a, 36b, 38a, 38b are not limited. It is preferable that each of the first and second liquid-storage chambers 36a, 36b and the first and second vapor-storage chambers 38a, 38b has a volume that can contain the first and second monomer liquids 35a, 35b and the first and second monomer vapors 37a, 37b in an amount that can perform the vacuum deposition polymerization 50 times or less. If the volume of each of the chambers 36a, 36b, 38a, and 38b is bigger than the above, a large amount of monomers (the first and second monomer liquids 35a, 35b and the first and second monomer vapors 37a, 37b) should be heated in one time. Therefore, heating efficiency of monomers by heaters 33a, 33b, which will be described later, may be extremely deteriorated.

To the first vapor-storage chamber 38a of the first evaporation source container 32a and to the second vapor-storage chamber 38b of the second evaporation source container 32b, the monomer inlet pipes 26a, 26b are connected, respectively. Further, the first and second vapor-storage chambers 38a, 38b are provided with monomer vapor pressure sensors 40a, 40b, respectively. The monomer vapor pressure sensors 40a, 40b and the heaters 33a, 33b are connected to a controller, which is not shown.

In the apparatus for forming an organic polymer thin film according to the present invention, by opening the monomer inlet-side pressure control valves 28a, 28b while the vacuum pump 18 is working, insides of the first and second evaporation source containers 32a, 32b, as well as the deposition chamber 10 and mixing chamber 23, are each made to be in a vacuum state or under reduced pressure. Further, the first and second evaporation source containers 32a, 32b whose insides are in a vacuum state are heated by the heaters 33a, 33b, while the gate valves 34a, 34b are opened, so that the first and second monomer liquids 35a, 35b, which are different kinds and contained in the first and second liquid-storage chambers 36a, 36b of the first and second evaporation source containers 32a, 32b, are evaporated. Then, the evaporated first and second monomer liquids 35a, 35b are introduced into the first and second vapor-storage chambers 38a, 38b of the first and second evaporation source containers 32a, 32b, and contained therein as the first and second monomer vapors 37a, 37b, respectively (see Fig 3).

This evaporation operation of the first and second monomer liquids 35a, 35b is performed while the monomer inlet-side pressure control valves 28a, 28b, which are provided on the monomer inlet pipes 26a, 26b, are closed. At that time, heating temperatures of the heaters 33a, 33b are controlled by a controller, which is not shown, based on a value detected by a heat sensor such as a thermocouple (not shown), such that internal pressures of the first and second vapor-storage chambers 38a, 38b to be detected by the monomer vapor pressure sensors 40a, 40b reaches the predetermined value. Then, under the condition in which the internal pressures of the first and second vapor-storage chambers 38a, 38b are controlled to be the predetermined values, the monomer inlet-side pressure control valves 28a, 28b are opened and closed under control by a controller, which is not shown, such that the values detected by the inlet-side pressure sensors 30a, 30b reach the predetermined value. As a result, the first and second monomer vapors 37a, 37b are introduced into the mixing chamber 23 and the deposition chamber 10 through the monomer inlet pipes 26a, 26b from the first and second vapor-storage chambers 38a, 38b of the first and second evaporation source containers 32a, 32b.

The apparatus for forming an organic polymer thin film of the present embodiment includes monomer supply mechanisms 42, 42 for each of the first and second evaporation source containers 32a, 32b. Each of the monomer supply mechanisms 42, 42 supplies the monomer in a liquid form into each of the first and second liquid-storage chambers 36a, 36b of the first and second evaporation source containers 32a, 32b, and has a special structure that cannot be found in the conventional apparatuses.

Specifically, the monomer supply mechanism 42 includes a storage tank 44 containing the first monomer liquid 35a or the second monomer liquid 35b, and a suction tube 45, as a communication passage, which suctions the first monomer liquid 35a or the second monomer liquid 35b contained in the storage tank 44.

The storage tank 44 of the monomer supply mechanism 42 is constituted by a hermetically sealed tank. To the upper wall thereof, a monomer supply tube 46 and an inert gas supply tube 48 are connected. At the middle of the monomer supply tube 46, a valve 50 for monomer supply is provided, and at the middle of the inert gas supply tube 48, a gas pressure control valve 52 for storage tank is provided. Further, the end of the monomer supply tube 46 is connected to a monomer throwing hopper 54, and the end of the inert gas supply tube 48 is connected to an inert gas canister 56 which is filled with inert gas such as helium gas, neon gas, argon gas, or nitrogen gas.

Figure 8:
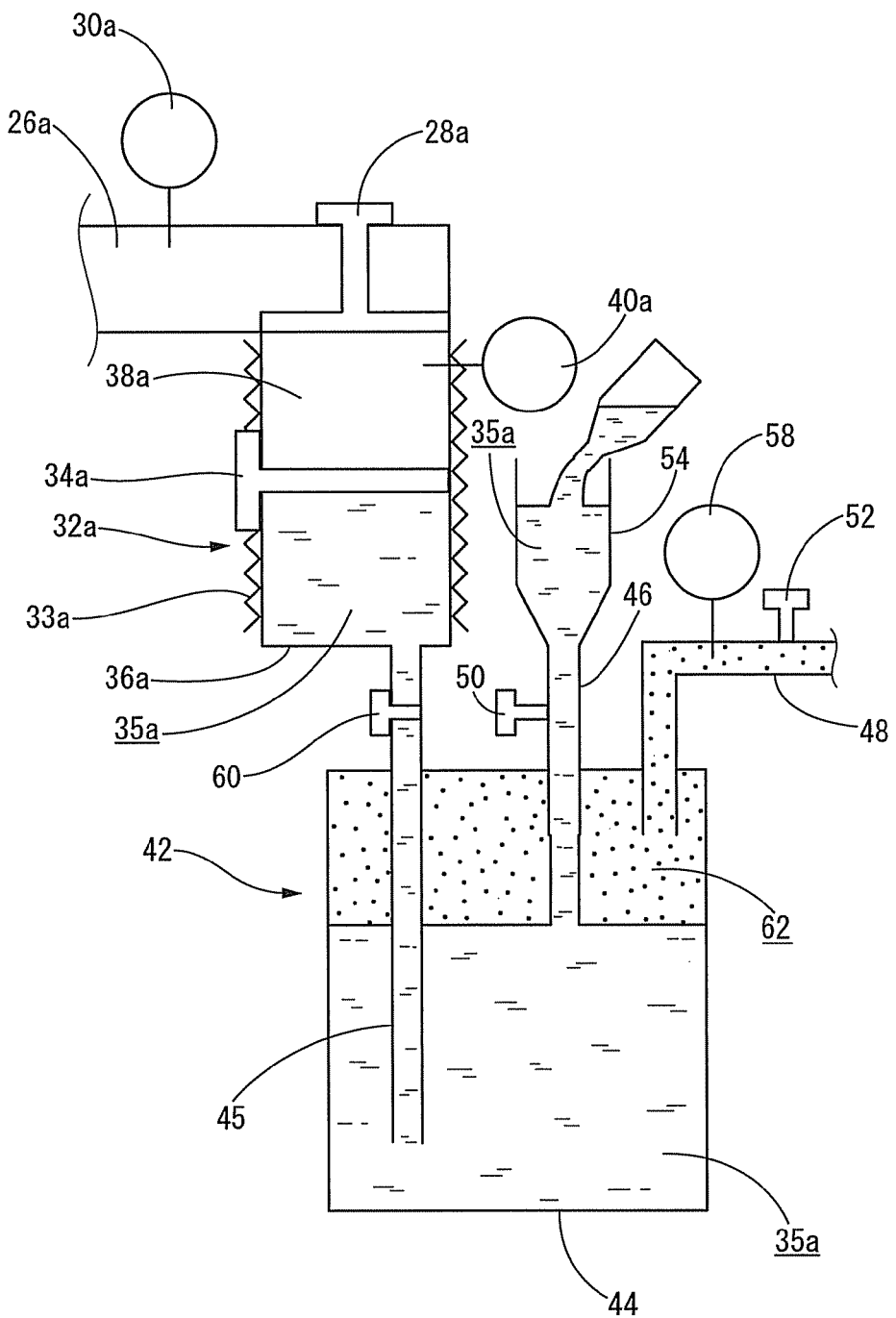
FIG. 8 is an explanatory view showing a step subsequent to the step in FIG. 7, in which the monomer is supplied to the monomer storage tank in a liquid form.

In the monomer supply mechanism 42, the first monomer liquid 35a or the second monomer liquid 35b is supplied to the storage tank 44 through the monomer supply tube 46 and is contained therein by opening the valve 50 for monomer supply provided on the monomer supply tube 46, while the first monomer liquid 35a or the second monomer liquid 35b is supplied into a monomer throwing hopper 54 (see FIG. 8).

Further, by opening the gas pressure control valve 52 provided on the inert gas supply tube 48, the space inside the storage tank 44 is filled with inert gas. Accordingly, it is prevented that the first monomer liquid 35a or the second monomer liquid 35b is reacted with oxygen or moisture in the atmosphere, deteriorated by contacting with oxygen or moisture in the atmosphere, or subjected to self-polymerization. The gas pressure control valve 52 is connected to a controller, which is not shown, and internal pressure of the storage tank 44, which is detected by a storage tank pressure sensor 58 provided on the inert gas supply tube 48 is controlled to be always in a predetermined value (here, a predetermined value above the atmospheric pressure) by opening and closing the gas pressure control valve 52 by using the controller.

The suction tube 45 extends in a vertical direction through the upper wall of the storage tank 44. The top end of the suction tube 45 is connected to the first or second liquid-storage chamber 36a, 36b of the first or second evaporation source container 32a, 32b. An opening portion at the lower end of the suction tube 45 opens at the position close to an inner surface of the bottom wall of the storage tank 44, while an opening portion at the upper end of the suction tube 45 communicates with the first or second liquid-storage chamber 36a, 36b of the first or second evaporation source container 32a, 32b. Further, at the middle of the suction tube 45, which is positioned outside the storage tank 44, a valve 60 for monomer suction as a first open/close mechanism is provided.

When the first and second evaporation source containers 32a, 32b are in a vacuum state or under reduced pressure, by opening the valve 60 for monomer suction, the first and second monomer liquids 35a, 35b contained in the respective storage tanks 44 having an internal pressure above the atmospheric pressure can be suctioned to the first and second liquid storage chambers 36a, 36b of the first and second evaporation source containers 32a, 32b through the suction tube 45, based on the difference in the internal pressure between the storage tank 44 and the first and second evaporation source containers 32a, 32b.

When organic polymer thin films are formed on surfaces of a plurality of substrates 12 disposed in the deposition chamber 10 in turn, by using the apparatus of the present embodiment having the above structure, the organic polymer thin films are formed according to the following method.

Specifically, as shown in FIG. 1, before formation operation of organic polymer thin film starts, the substrate 12 is disposed in the deposition chamber 10. In the meantime, the first liquid-storage chamber 36a of the first evaporation source container 32a is filled with the first monomer liquid 35a, and the second liquid-storage chamber 36b of the second evaporation source container 32b is filled with the second monomer liquid 35b.

The first and second liquid-storage chambers 36a, 36b are filled with the first and second monomer liquids 35a, 35b by, for example, suctioning the first and second monomer liquids 35a, 35b through the suction tubes 45, 45 from the storage tanks 44, 44 communicating with the first and second liquid-storage chambers 36a, 36b, by opening the valves 60, 60, while the gate valves 34a, 34b in the first and second evaporation source containers 32a, 32b are closed, while the first and second liquid-storage chambers 36a, 36b are in a vacuum state.

Figure 2:
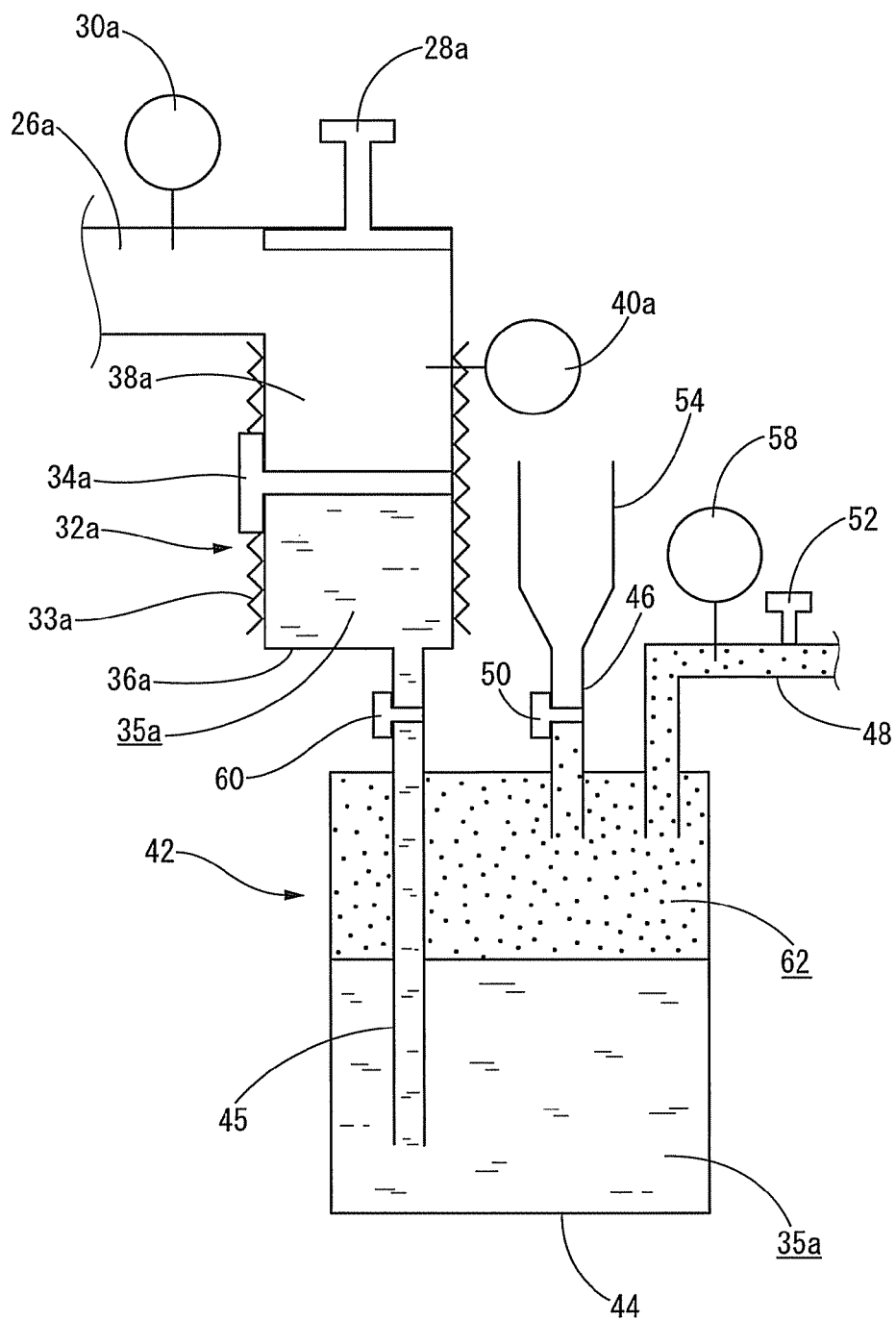
FIG. 2 is an explanatory view showing one step of forming an organic polymer thin film on a surface of a substrate by using the apparatus shown in FIG. 1, in which the evaporation source container is in a vacuum state.

Before the first and second liquid-storage chambers 36a, 36b are filled with the first and second monomer liquids 35a, 35b, each of the storage tanks 44, 44, in which the first and second liquid-storage chambers 36a, 36b are each to be contained, is filled with inert gas 62 contained in the inert gas canister 56 (see FIG. 2). It is preferable that the internal pressure (detected value by the storage tank pressure sensor 58) of each of the storage tanks 44, 44 filled with the inert gas 62 is above the atmospheric pressure. Due to this, the first and second liquid-storage chambers 36a, 36b can be filled with the first and second monomer liquids 35a, 35b in a shorter time and smoothly.

The first and second monomer liquids 35a, 35b to be used herein are suitably determined depending on a kind of organic polymer thin film to be formed on a surface of the substrate 12. For example, as the first and second monomer liquids 35a, 35b, diamine and carboxylic anhydride are used when a polyimide film is formed, aromatic diamine and aromatic diisocyanate are used when an aromatic polyurea film is formed, aromatic diamine and aromatic dicarboxylic acid are used when an aromatic polyamide film is formed, aliphatic (including alicyclic) diamine and aliphatic (including alicyclic) diisocyanate are used when an aliphatic polyurea film is formed, aliphatic (including alicyclic) diamine and aliphatic (including alicyclic) dicarboxylic acid are used when an aliphatic polyamide film is formed, diol and dicarboxylic acid are used when a polyester film is formed, and polyol and polyisocyanate are used when a polyurethane film is formed.

As shown in FIG. 2, before starting the formation operation of organic polymer thin film, the monomer inlet-side pressure control valve 28a, which is provided on the monomer inlet pipe 26a, is opened. At the same time, although not shown in the drawings, the monomer inlet-side pressure control valve 28b, which is provided on the monomer inlet pipe 26b, is also opened. Under such state, by operating the vacuum pump 18, insides of the deposition chamber 10, the mixing chamber 23, the monomer inlet pipes 26a, 26b, the first evaporation source container 32a (the first storage chamber 38a for monomer vapor), and the second evaporation source container 32b (the second storage chamber 38b for monomer vapor) are each made to be in a vacuum state (reduced pressure state). Generally, the pressure inside the deposition chamber 10, which is detected by the deposition chamber pressure sensor 14, is controlled to be within a range of from about $10^{-3}$ to 100 Pa.

Thereafter, as shown in FIG. 3, while the monomer inlet-side pressure control valve 28a is closed, the gate valve 34a is opened. Accordingly, the first evaporation source container 32a is hermetically sealed, and the first liquid-storage chamber 36a and the first vapor-storage chamber 38a are communicated with each other. Then, under this state, by heating the first evaporation source container 32a by the heater 33a, the first monomer liquid 35a in the first liquid-storage chamber 36a is evaporated. As a result, the first monomer vapor 37a is generated and allowed to be contained in the first vapor-storage chamber 38a. At this time, vapor pressure in the first vapor-storage chamber 38a is controlled by controlling the temperature of the heater 33a such that the detected value by the monomer vapor pressure sensor 40a is in a predetermined value. In addition, although not shown in the drawings, in the second liquid-storage chamber 36b, the second monomer liquid 35b is evaporated as the above and the second monomer vapor 37b is allowed to be contained in the second vapor-storage chamber 38b.

Figure 4:
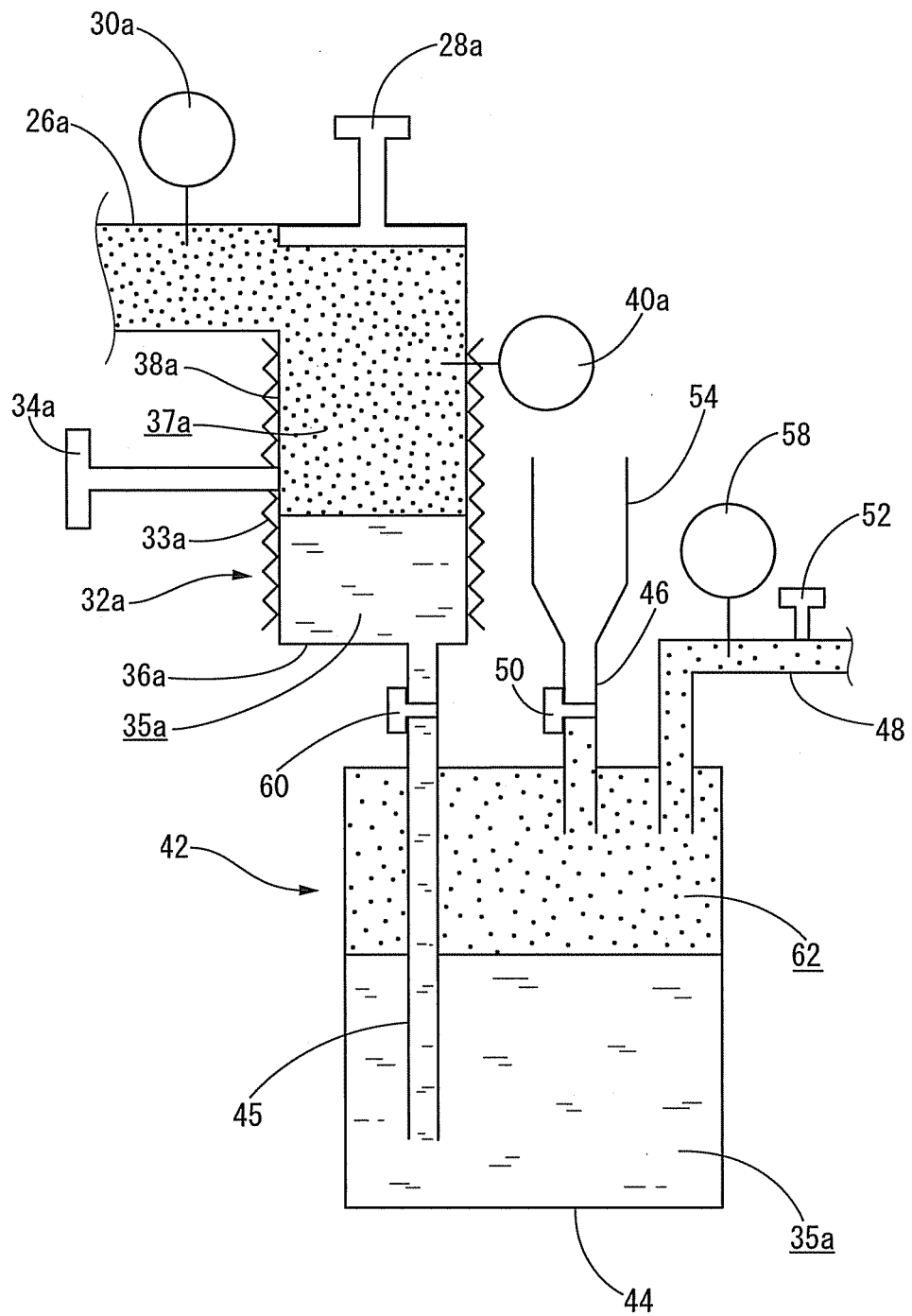
FIG. 4 is an explanatory view showing a step subsequent to the step in FIG. 3, in which a predetermined amount of the evaporated monomer is introduced into the deposition chamber from the evaporation source container.

Then, when the detected value by the monomer vapor pressure sensor 40a reached the predetermined value, the monomer inlet-side pressure control valve 28a is opened as shown in FIG. 4 under control of a controller, which is not shown. Accordingly, the first monomer vapor 37a in the first vapor-storage chamber 38a is introduced into the mixing chamber 23, further into the deposition chamber 10, through the monomer inlet pipe 26a. At this time, the monomer inlet-side pressure control valve 28a is opened or closed by a controller, which is not shown, such that the value detected by the inlet-side pressure sensors 30a provided on the monomer inlet pipe 26a is controlled to be lower than the value detected by the monomer vapor pressure sensor 40a and to be higher than the detected value by the deposition chamber pressure sensor 14.

Although not shown in the drawings, the monomer inlet-side pressure control valve 28b is also opened or closed by a controller, which is not shown, such that the value detected by the inlet-side pressure sensor 30b provided on the monomer inlet pipe 26b is controlled to be lower than the value detected by the monomer vapor pressure sensor 40b and to be higher than the detected value by the deposition chamber pressure sensor 14. Accordingly, the second monomer vapor 37b in the second vapor-storage chamber 38b is introduced into the mixing chamber 23, further into the deposition chamber 10, through the monomer inlet pipe 26b.

Then, after the first monomer vapor 37a and the second monomer vapor 37b introduced into the mixing chamber 23 are diffused by the two diffuser panels 24, 24, they are introduced into the deposition chamber 10, and guided to a surface of the substrate 12. The first monomer vapor 37a and the second monomer vapor 37b are polymerized thereon to generate a polymer. Therefore, an organic polymer thin film formed of the polymer is formed on the surface of the substrate 12 by the vacuum deposition polymerization.

It is preferable that the pressure in the deposition chamber 10, which is detected by the deposition chamber pressure sensor 14, is higher than the pressure before the first monomer liquid 35a and the second monomer liquid 35b are evaporated, i.e., the pressure before the film forming operation. By setting the pressure as above, it can be prevented to the maximum extent possible that the first monomer vapor 37a and the second monomer vapor 37b introduced into the deposition chamber 10 are passed through the deposition chamber 10 and trapped in the trap device 22 without being polymerized on the surface of the substrate 12. Thus, the first monomer vapor 37a and the second monomer vapor 37b introduced into the deposition chamber 10 can be more advantageously and effectively utilized. As a result, an organic polymer thin film can be effectively formed on the surface of the substrate 12, thereby advantageously increasing the amount of organic polymer thin film to be formed per unit time.

In the formation of the organic polymer thin film by the vacuum deposition polymerization, the target value of each of the inlet-side pressure sensors 30a, 30b at the time of introducing the first monomer vapor 37a and the second monomer vapor 37b into the deposition chamber 10 is set such that the first monomer vapor 37a and the second monomer vapor 37b are to be stoichiometric proportion on a surface of the substrate 12 disposed in the deposition chamber 10. Such target value is predetermined on the basis of the result of preliminary test or on the basis of the experience.

Further, in the formation of film, it is preferable that insides of the deposition chamber 10 and the monomer inlet pipes 26a, 26b are heated by a heater, for example, such that values detected by the monomer vapor pressure sensors 40a, 40b provided on the first and second evaporation source containers 32a, 32b are to be predetermined values. Further, it is preferable that each storage tank 44, 44 is heated to have a temperature that is higher than melting points and lower than boiling points of the first and second monomers 35a, 35b to be contained therein. Further, it is preferable that the substrate 12 in the deposition chamber 10 and the trap device 22 are cooled to predetermined temperatures.

Figure 5:
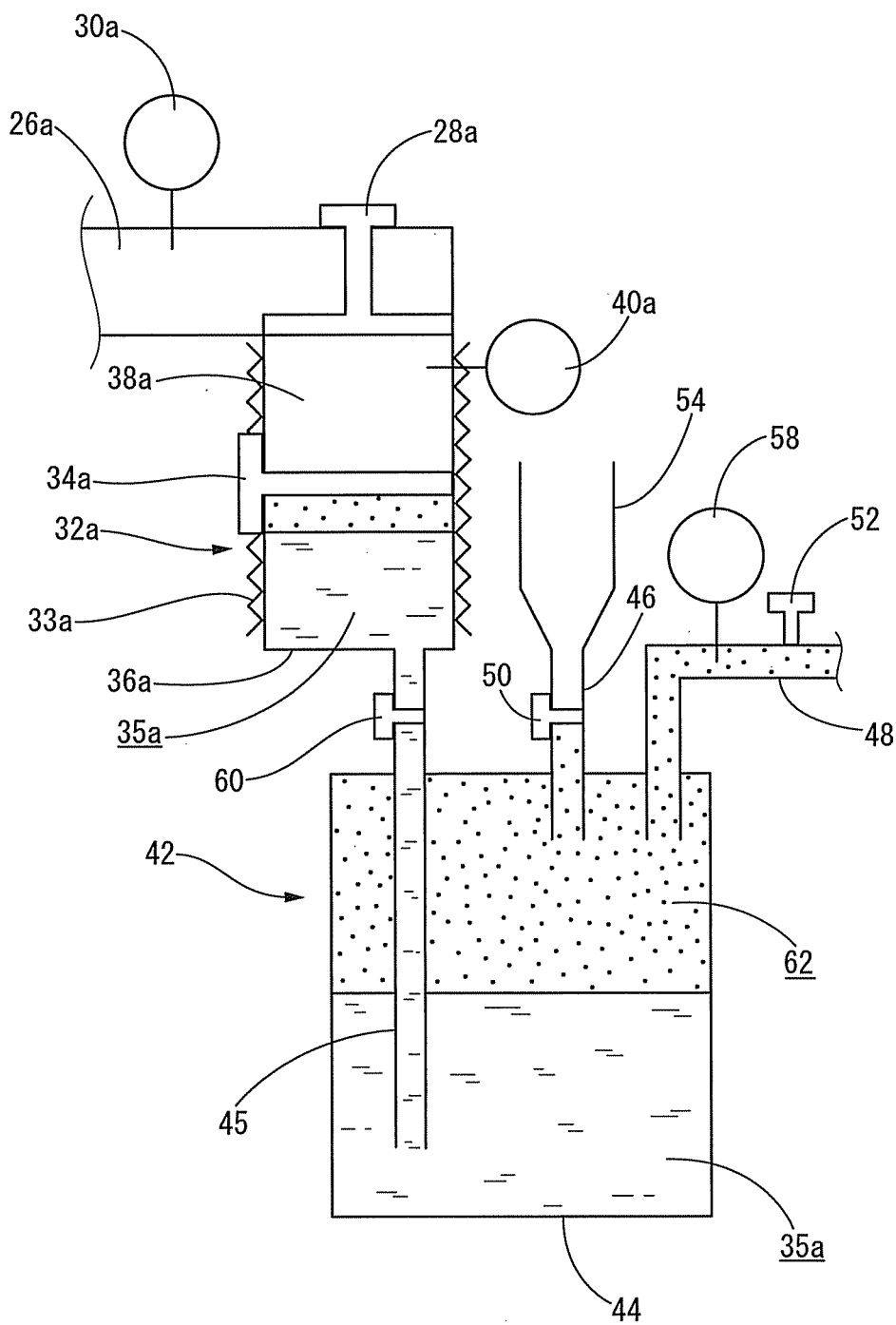
FIG. 5 is an explanatory view showing a state of the evaporation source container after one film forming operation, which is subsequent to the step in FIG. 4.

Then, after a predetermined time is passed from the beginning of evaporation operation of the first and second monomers 35a, 35b in the first and second liquid-storage chamber 36a, 36b, as shown in FIG. 5, the monomer inlet-side pressure control valve 28a and the gate valve 34a in the evaporation source container 32a are closed. At the same time, although not shown in the drawings, the monomer inlet-side pressure control valve 28b and the gate valve 34b in the evaporation source container 32b are also closed. Thus, the formation of organic polymer thin film on the surface of the substrate 12 is finished.

Then, after the substrate 12 on which the organic polymer thin film is formed is removed from the deposition chamber 10, another substrate 12 on which an organic polymer thin film is to be formed is disposed in the deposition chamber 10.

Figure 6:
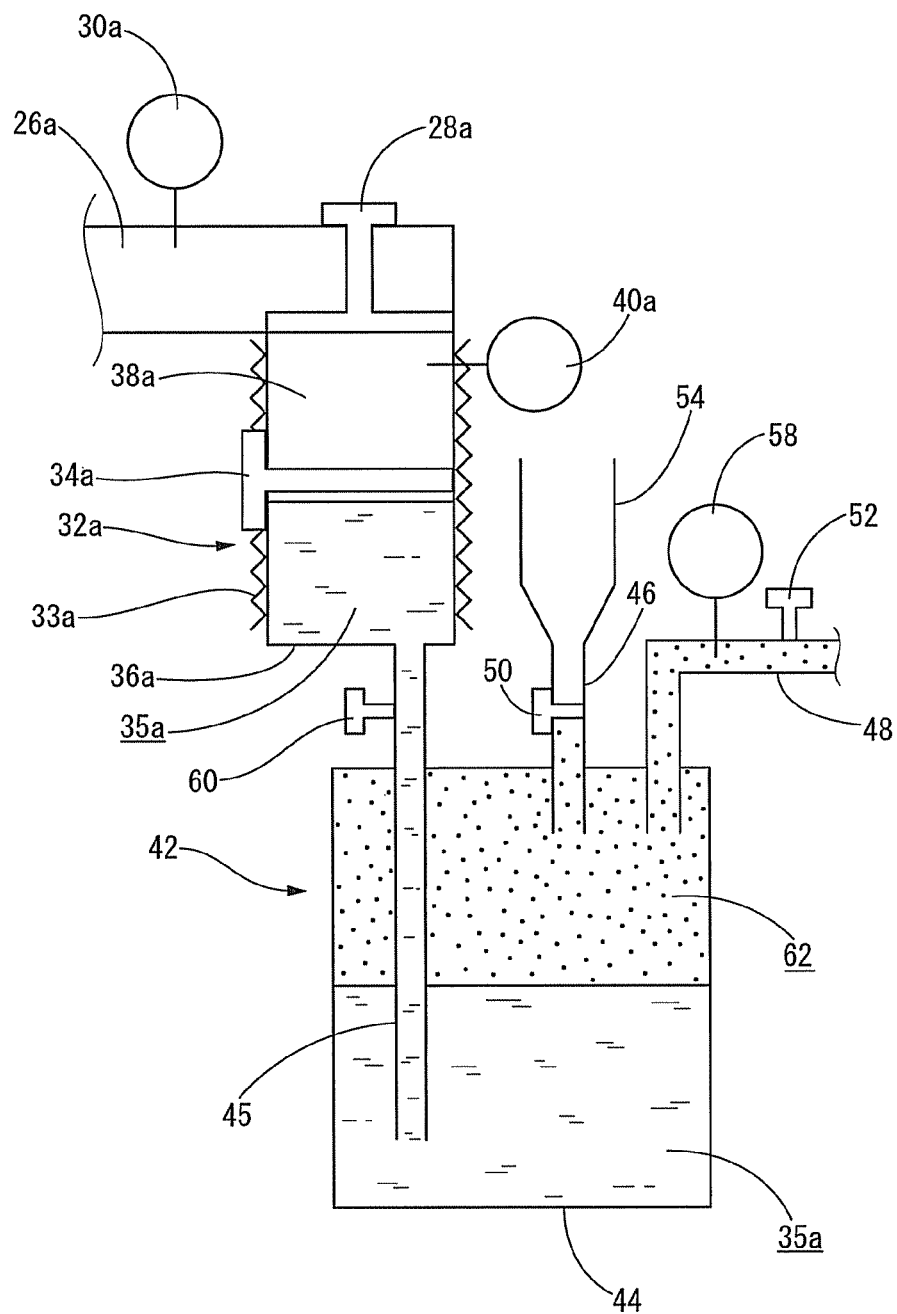
FIG. 6 is an explanatory view showing a step subsequent to the step in FIG. 5, in which monomer in a liquid form is supplied into the evaporation source container from a monomer storage tank, after one film forming operation was performed.
Figure 7:
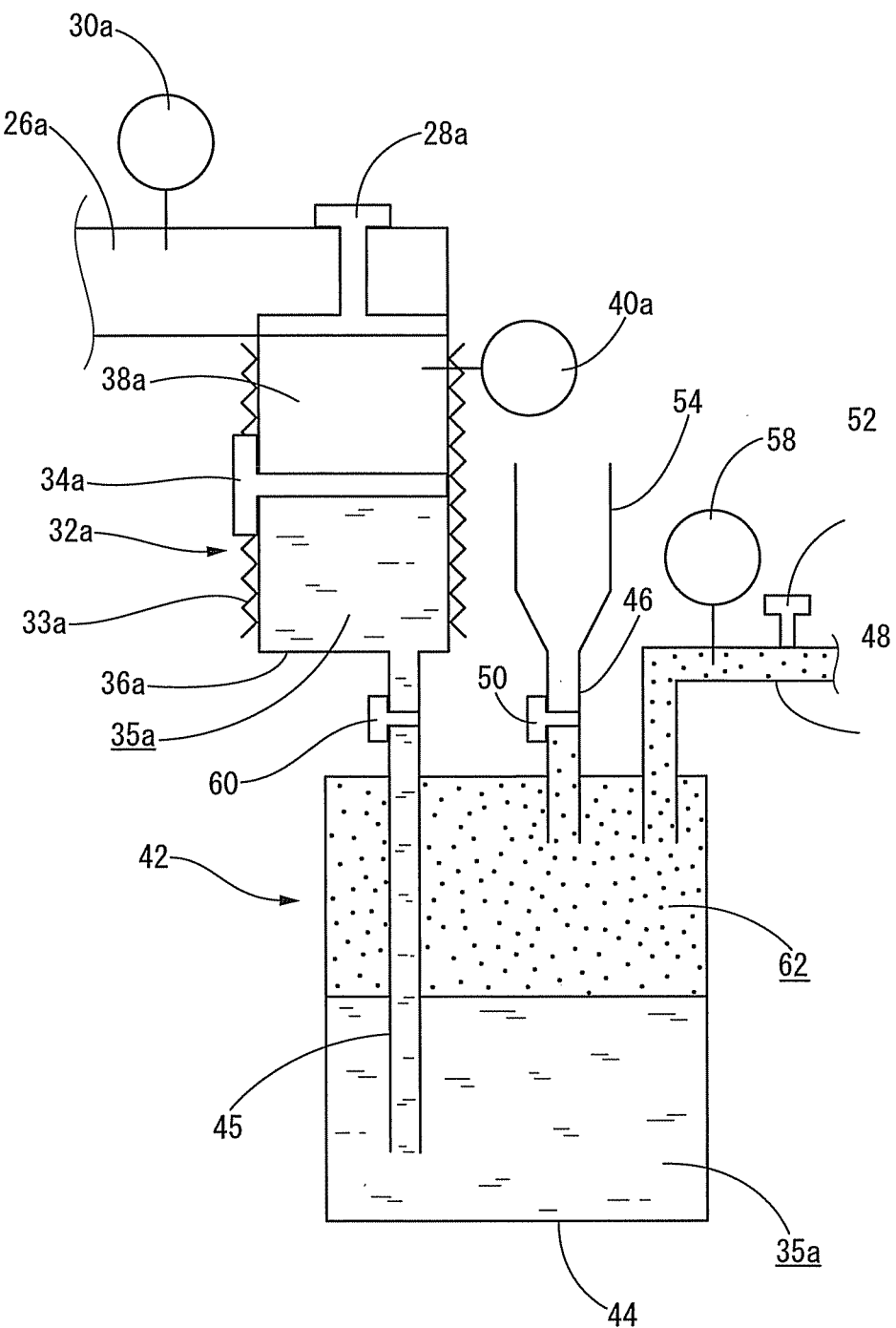
FIG. 7 is an explanatory view showing a step subsequent to the step in FIG. 6, in which the evaporation source container is filled with the monomer.

Meanwhile, as shown in FIG. 6, the valve 60 for monomer suction provided on the suction tube 45 communicating between the first liquid-storage chamber 36a and the storage tank 44 is opened, while the monomer inlet-side pressure control valve 28a and the gate valve 34a in the evaporation source container 32a are closed. At this time, the first liquid-storage chamber 36a in the evaporation source container 32a is in a reduced pressure state, and the pressure in the storage tank 44 is above the atmospheric pressure. By this difference in pressure, the first monomer liquid 35a in the storage tank 44 is automatically suctioned into the first liquid-storage chamber 36a through the suction tube 45. Then, as shown in FIG. 7, when the first liquid-storage chamber 36a is filled with the first monomer liquid 35a, the valve 60 is closed.

Further, although not shown in the drawings, the valve 60 for monomer suction provided on the suction tube 45 communicating between the second liquid-storage chamber 36b and the storage tank 44 is opened. By this opening, the second monomer liquid 35b in the storage tank 44 is automatically suctioned into the second liquid-storage chamber 36b through the suction tube 45, thereby filling the second liquid-storage chamber 36b with the second monomer liquid 35b. Then, the valve 60 is closed.

As described above, the first liquid-storage chamber 36a and the second liquid-storage chamber 36b are filled with the first monomer liquid 35a and the second monomer liquid 35b, respectively, like the state before the previous film formation is operated. Thus, the first monomer liquid 35a is supplied into the first liquid-storage chamber 36a by an amount equal to the amount that was used in the previous film formation, so that the same amount of the first monomer liquid 35a as the amount thereof, which was contained before the previous film formation was started; is to be contained in the first liquid-storage chamber 36a. At the same time, the second monomer liquid 35b is supplied into the second liquid-storage chamber 36b by an amount equal to the amount that was used in the previous film formation, so that the same amount of the first monomer liquid 35b as the amount thereof, which was contained before the previous film formation was started, is to be contained in the second liquid-storage chamber 36b. In other words, the state in the first evaporation source container 32a becomes as shown in FIG. 2 again, and the state in the second evaporation source container 32b becomes similar state as shown in FIG. 2.

Subsequently, like the above, an organic polymer thin film is formed on a surface of a substrate 12, which is newly disposed in the deposition chamber 10, by performing the steps shown in FIG. 2 to FIG. 5. Then, the first and second liquid-storage chambers 36a, 36b are refilled with the first and second monomer liquids 35a, 35b, as shown in FIG. 6 and FIG. 7. By repeating the above film formation and refilling, organic polymer thin films are formed on surfaces of a plurality of substrates 12 which are arranged in the deposition chamber 10 in turn.

In the formation of the organic polymer thin films on surfaces of a plurality of substrates 12 in such a batch process, if the amount of the first monomer liquid 35a contained in the storage tank 44, which is communicated with the first evaporation source container 32a, is reduced, the first monomer liquid 35a is supplied into the monomer throwing hopper 54, while the valve 50 for monomer supply is opened, as shown in FIG. 8. Thus, the first monomer liquid 35a is supplied into the storage tank 44. When the amount of the second monomer liquid 35b contained in the storage tank 44, which is communicated with the second evaporation source container 32b, is reduced, the same steps as the above are followed.

The above described refilling of each of the storage tanks 44, 44 with the first and second monomer liquids 35a, 35b can be conducted any time, even during the formation of film, as long as the valves 60, 60 for monomer suction provided on the suction tubes 45, 45 disposed in the storage tanks 44, 44 are closed. Further, in the present embodiment, air is not allowed to be mixed into the storage tanks 44, 44 during the refilling of the each storage tank 44, 44 with the first and second monomer liquids 35a, 35b, because the internal pressure of each storage tank 44, 44 is controlled to be above the atmospheric pressure. When the pressure in the each storage tank 44, 44 is lowered by leakage of the inert gas 62 to the outside while the first and second monomer liquids 35a, 35b are supplied, the gas pressure control valves 52, 52 are opened such that the inert gas 62 is immediately supplied into each of the storage tanks 44, 44 from the respective inert gas canisters 56, 56. Accordingly, the internal pressure in the each storage tank 44, 44 is maintained always to be above the atmospheric pressure. Further, it is preferable that a filter or the like that can capture or trap moisture is provided in each of the monomer supply tubes 46, 46.

As described above, when the apparatus for forming an organic polymer thin film of the present embodiment is used to form films by vacuum deposition polymerization, the amount of the first and second monomer liquids 35a, 35b to be contained in the first and second liquid-storage chambers 36a, 36b of the first and second evaporation source containers 32a, 32b is made always the same at the time of starting the evaporation operation of the first and second monomer liquids 35a, 35b. Consequently, in the repeated film formation, the amount of evaporation of the first and second monomer liquids 35a, 35b in one time is always the same depending on the predetermined heating temperature of the heaters 33a, 33b, without conducing a special control.

Thus, unlike the conventional apparatus in which the amount of evaporation of the first and second monomer liquids 35a, 35b in one time is inevitably varied in the repeated film formation, the apparatus for forming an organic polymer thin film of the present embodiment can control the amount of the first and second monomer vapors 37a, 37b introduced into the deposition chamber 10 under the stable condition without variation. Therefore, even if the first and second monomer liquids 35a, 35b have low reactivity, for example, the first and second monomer liquids 35a, 35b can be stably introduced into the deposition chamber 10 in the required amount. Accordingly, a monomer proportion on the surface of the substrate 12 can easily and surely be stoichiometric proportion.

In addition, in the apparatus for forming an organic polymer thin film of the present embodiment, the internal pressures of the first and second evaporation source containers 32a, 32b of the first and second vapor-storage chambers 38a, 38b are made the highest, the internal pressures of the monomer inlet pipes 26a, 26b are made the second highest, and the internal pressure of the deposition chamber 10 is made the lowest. As a result, during the film forming operation, the first and second monomer vapors 37a, 37b can be introduced into the deposition chamber 10 extremely stably and smoothly from the first and second vapor-storage chambers 38a, 38b.

Accordingly, high efficiency of film formation can be achieved by using the apparatus for forming an organic polymer thin film of the present embodiment. In addition, organic polymer thin films of the same quality having a predetermined composition and constant thickness can be always formed on surfaces of the substrates 10, which are disposed in the deposition chamber 10 in turn, with excellent reproducibility and stability, regardless of the reactivity of the first and second monomer vapors 37a, 37b.

Further, in the apparatus for forming an organic polymer thin film of the present embodiment, only by opening the valves 60, 60, a required amount of the first and second monomer liquids 35a, 35b, which are contained in the storage tanks 44, 44, respectively, is automatically suctioned into the first and second liquid-storage chambers 36a, 36b, based on the differences in the pressures between the storage tanks 44, 44 and the first and second storage liquid-chambers 36a, 36b. Therefore, the structure of the monomer supply mechanism 42, 42 may be advantageously simplified and the first and second monomer liquids 35a, 35b can be readily and effectively supplied into, the first and second liquid-storage chambers 36a, 36b.

Figure 9:
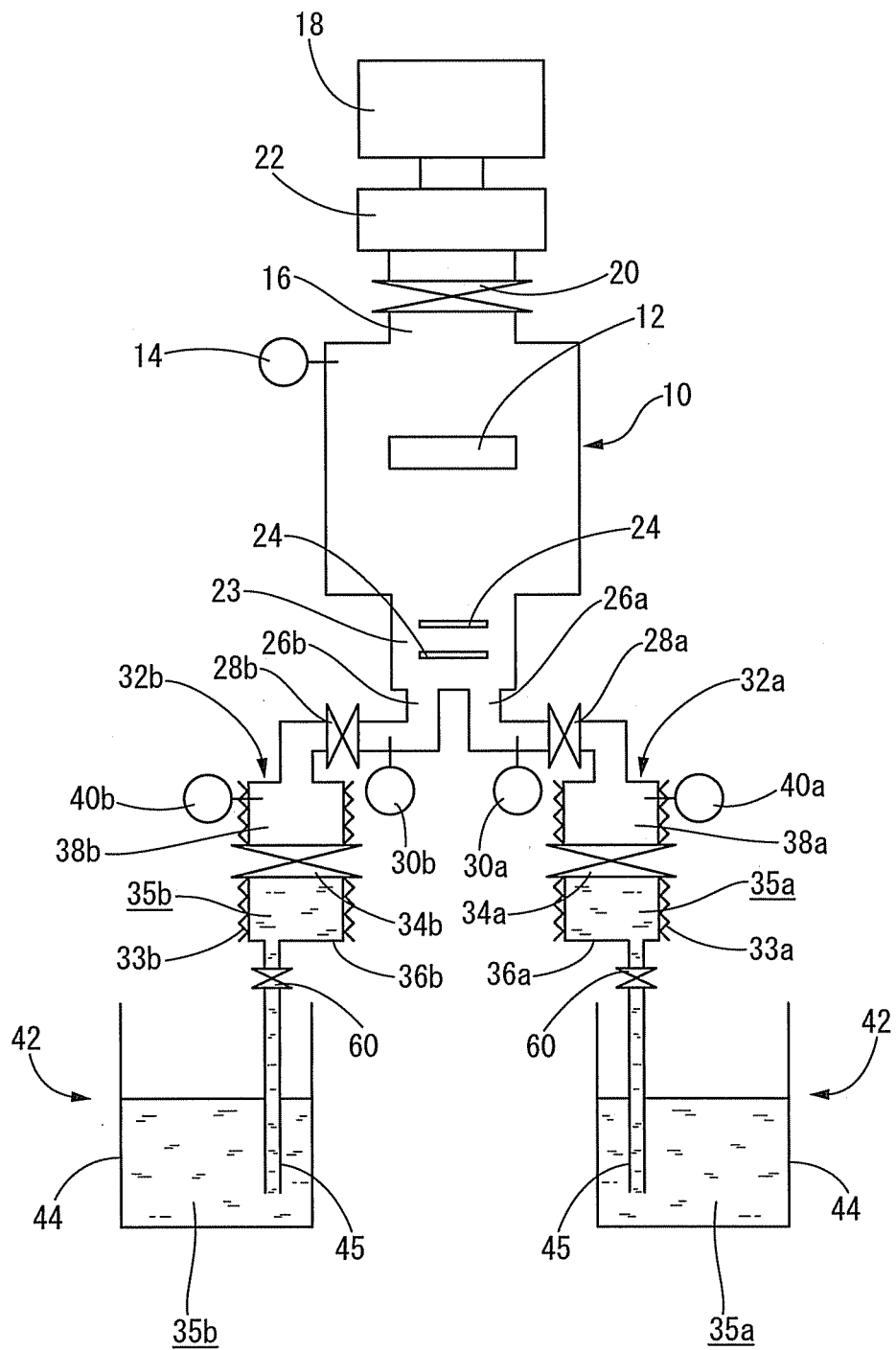
FIG. 9 is an explanatory view showing another example of the apparatus for forming an organic polymer thin film, which has a structure according to the present invention.

In the first embodiment, the mechanism for filling the storage tank 44 with the inert gas 62 is provided. However, this mechanism may be omitted. In that case, the storage tank 44 is constituted by an open container, as shown in FIG. 9, for example. Then, the monomer supply tube 46 and the valve 50 for monomer supply provided thereon, the inert gas supply tube 48 and the gas pressure control valve 52 provided thereon, the storage tank pressure sensor 58, the monomer throwing hopper 54, and the inert gas canister 56 may be all omitted. Therefore, the structure of the monomer supply mechanism 42 may be effectively simplified.

Figure 10:
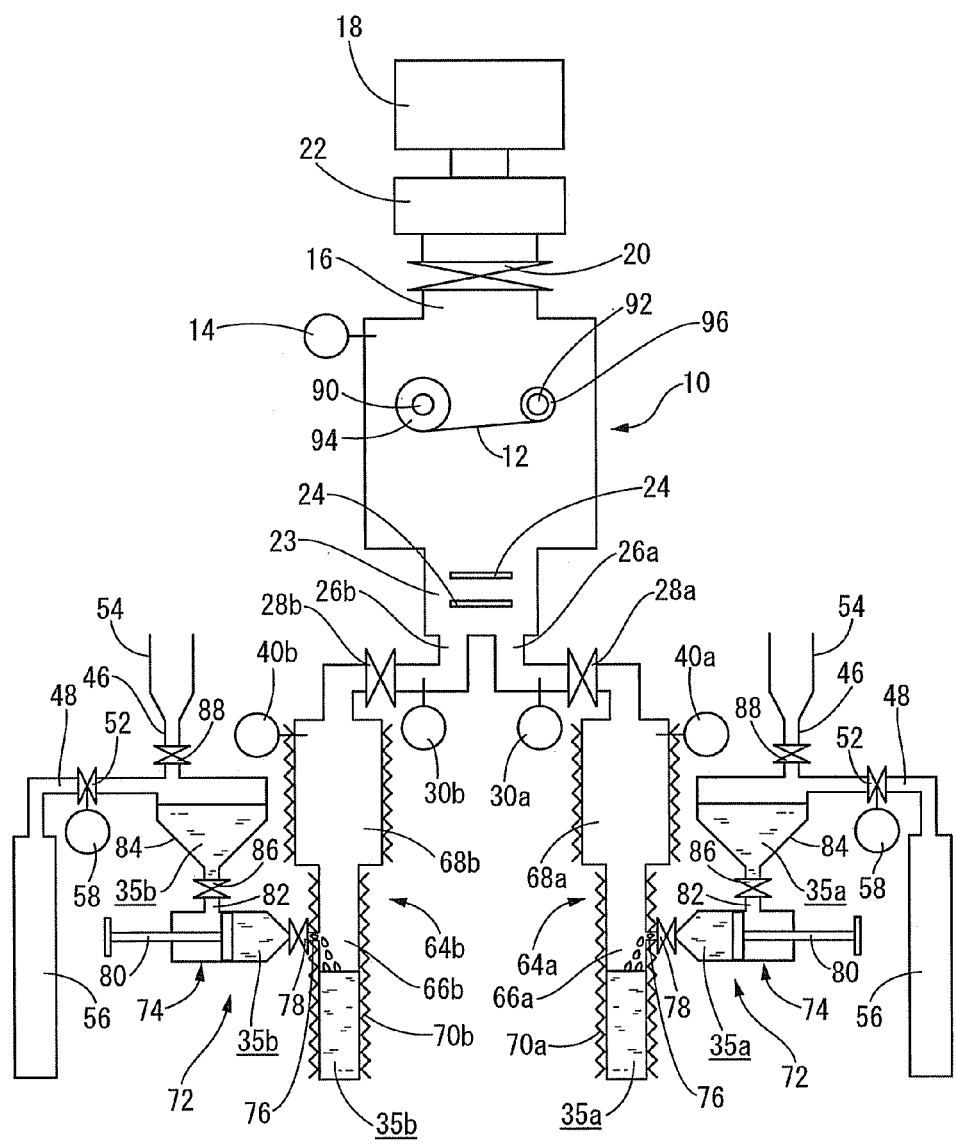
FIG. 10 is an explanatory view showing still another example of the apparatus for forming an organic polymer thin film, which has a structure according to the present invention.
Figure 11:
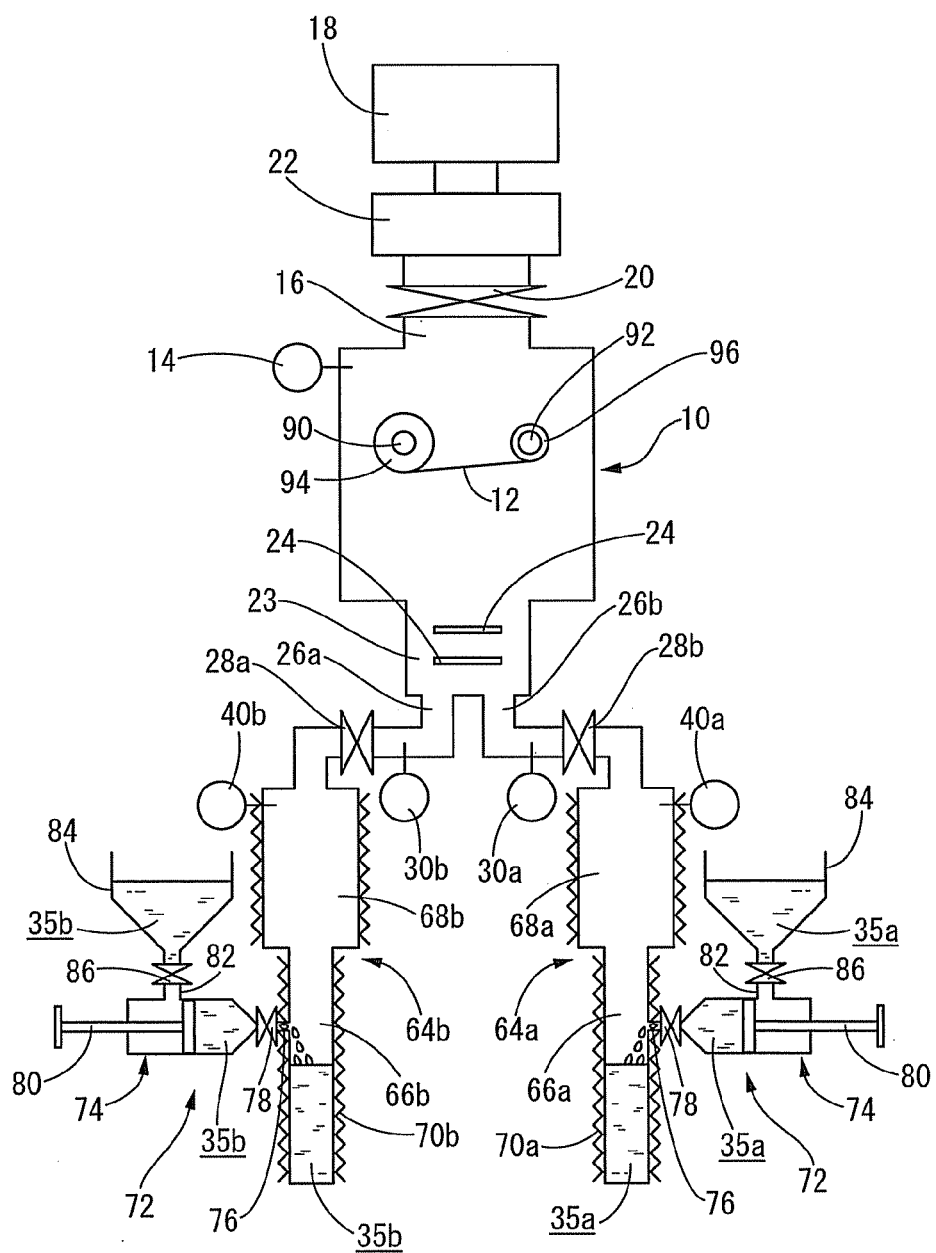
FIG. 11 is an explanatory view showing a further example of the apparatus for forming an organic polymer thin film, which has a structure according to the present invention.

Then, FIG. 10 shows another example of an apparatus for forming an organic polymer thin film according to the present invention, which has a structure partly different from the first and second embodiments. This embodiment and a still another embodiment, which is different from this embodiment and is shown in FIG. 11, have the first and second evaporation source containers and monomer supply mechanism that have structures different from the first and second embodiments. The structures of the first and second evaporation source containers and the monomer supply mechanism of these embodiments are explained below. The same reference numerals as used in FIG. 1 are used for members and portions having the same structures as those of the first embodiment, and a detailed explanation of which is dispensed with.

Specifically, as apparent from FIG. 10, in the apparatus for forming an organic polymer thin film of this embodiment, the first evaporation source container 64a is constituted by a hermitically sealed container extending in a vertical direction. The lower portion of the first evaporation source container 64a is made as a first liquid-storage chamber 66a for monomer liquid, and the upper portion thereof is made as a first vapor-storage chamber 68a for monomer vapor. In the first evaporation source container 64a, a valve or the like is not provided between the first liquid-storage chamber 66a and the first vapor-storage chamber 68a. The first liquid-storage chamber 66a and the first vapor-storage chamber 68a are always communicated with each other. Further, like the first evaporation source container 64a, the second evaporation source container 64b includes a second liquid-storage chamber 66b constituted by the lower portion thereof and a second vapor-storage chamber 68b constituted by the upper portion thereof. The second liquid-storage chamber 66b and the second vapor-storage chamber 68b are always communicated with each other. Further, on a periphery of the first and second evaporation source containers 64a, 64b, heaters 70a, 70b for heating respective spaces inside the evaporation source containers 64a, 64b are provided.

Then, in this embodiment, each of monomer supply mechanisms 72, 72 which supply the first and second monomer liquids 35a, 35b into the first and second liquid-storage chambers 66a; 66b of the first and second evaporation source containers 64a, 64b is provided with a special structure. As apparent from FIG. 10, the monomer supply mechanism 72 which supplies the first monomer liquid 35a into the first liquid-storage chamber 66a and the monomer supply mechanism 72 which supplies the second monomer liquid 35b into the second liquid-storage chamber 66b have the same structure. Therefore, it is to be understood that, as a representative of the two monomer supply mechanisms 72, 72, only the structure of the monomer supply mechanism 72 which supplies the first monomer liquid 35a into the first liquid-storage chamber 66a is described hereinafter, and an explanation of the monomer supply mechanism 72 which supplies the second monomer liquid 35b into the second liquid-storage chamber 66b is dispensed with.

Specifically, the monomer supply mechanism 72 which supplies the first monomer liquid 35a into the first liquid-storage chamber 66a includes a hydraulic cylinder 74 containing the second monomer liquid 35a therein. A nozzle 76 is provided on the top of the hydraulic cylinder 74, and through the nozzle 76, the hydraulic cylinder 74 is communicated with the first liquid-storage chamber 66a. Further, at the middle of the extending direction of the nozzle 76, an open/close valve 78 is provided. Further, a piston rod 80 of the hydraulic cylinder 74 is connected to a hydraulic mechanism, which is not shown. Open/close operation of the open/close valve 78 and protraction/retraction operation of the hydraulic cylinder 74 are controlled by a controller, which is not shown.

Then, while the open/close valve 78 is opened by the controller, the first monomer liquid 35a contained in the hydraulic cylinder 74 is continuously supplied into the first liquid-storage chamber 66a through the nozzle 76 at a constant speed by retracting the piston rod 80 of the hydraulic cylinder 74 at a constant speed. It is preferable that the amount of the first monomer liquid 35a (the second monomer liquid 35b) to be contained in the hydraulic cylinder 74 is larger than the amount of the first monomer liquid 35a (the second monomer liquid 35b) to be used from beginning to end of a continuous film forming operation on a surface of the substrate 12, which will be described later.

To the hydraulic cylinder 74, a storage tank 84 is connected via a communication pipe 82. The storage tank 84 has a larger volume than the hydraulic cylinder 74 and contains the first monomer liquid 35a therein. Here, the first monomer liquid 35a in the storage tank 84 is supplied into the hydraulic cylinder 74 by opening a valve 86 for supplying first monomer, which is provided on the middle portion of the communication pipe 82.

In the present embodiment, the storage tank 84 is constituted by a hermetically sealed container. To this storage tank 84, the inert gas canister 56 is connected via the inert gas supply tube 48, and the monomer throwing hopper 54 is connected via the monomer supply tube 46. Further, the gas pressure control valve 52 for storage tank is provided on the inert gas supply tube 48, and a valve for supplying second monomer 88 is provided on the monomer supply tube 46. Accordingly, like the above-described first embodiment, the first monomer liquid 35a is allowed to be supplied into the storage tank 84 from the monomer throwing hopper 54, and the storage tank 84 is allowed to be filled with the inert gas 62.

Further in this embodiment, a feeding roll 90, and a take up roll 92 which can be rotationally driven by an electrical motor which is not shown, are disposed in the deposition chamber 10 with a predetermined distance therebetween. A roll 94 of the substrate 12 formed of a long film, for example, is disposed outwardly of the feeding roll 90 and arranged in the deposition chamber 10. An end portion of the substrate 12, which is unwound from the roll 94, is fixed to a reel 96 which can be removed from the take up roll 92 and can be rotated with the take up roll 92. The electrical motor which rotationally drives the take up roll 92 can be controlled by a controller, which is not shown.

When an organic polymer thin film is continuously formed on a surface of the substrate 12 which is unwound from the roll 94 disposed in the deposition chamber 10 by vacuum deposition polymerization, by using the apparatus for forming an organic polymer thin film of the present embodiment having the above structure, the film is formed as follows, for example.

Specifically, initially, the open/close valve 78 provided on the nozzle 76 of the hydraulic cylinder 74 of the respective monomer supply mechanisms 72, 72 is closed, while the first and second monomer liquids 35a, 35b are contained in the first and second liquid-storage chambers 66a, 66b of the first and second evaporation source containers 64a, 64b, respectively, in a predetermined amount. Then, the storage tanks 84, 84 of the monomer supply mechanisms 72, 72 are filled with the inert gas supplied from the inert gas canisters 56, 56. The internal pressure of the storage tank 84 is controlled to be above the atmospheric pressure.

Then, in the same way as the apparatuses for forming an organic polymer thin film according the first and second embodiments, the first and second evaporation source containers 64a, 64b are heated by the heaters 70a, 70b, while the deposition chamber 10 and the first and second evaporation source containers 64a, 64b are in vacuum state, thereby evaporating the first and second monomer liquids 35a, 35b contained in the first and second liquid-storage chambers 66a, 66b of the first and second evaporation source containers 64a, 64b. Accordingly, the first and second monomer vapors 37a, 37b are contained in the first and second vapor-storage chambers 68a, 68b, respectively.

When the values detected by the monomer vapor pressure sensors 40a, 40b reached the predetermined values, under control of the controller, which is not shown, the monomer inlet-side pressure control valves 28a, 28b are opened, in the same way as the apparatuses for forming an organic polymer thin film according the first and second embodiments. Accordingly, the first and second monomer vapors 37a, 37b in the first and second vapor-storage chambers 68a, 68b are introduced into the mixing chamber 23, further into the deposition chamber 10, through the monomer inlet pipes 26a, 26b.

In addition, when the values detected by the monomer vapor pressure sensors 40a, 40b reached the predetermined values, under control of a controller, which is not shown, an electric motor is operated to rotationally drive the take up roll 92, thereby rotating the take up roll 92 at a constant speed. As a result, the substrate 12 is gradually unwound from the roll 94 disposed in the deposition chamber 10, and the unwound substrate 12 is wound by the reel 96 set on the take up roll 92.

Then, the first monomer vapor 37a and the second monomer vapor 37b introduced into the mixing chamber 23 are introduced into the deposition chamber 10, after diffused by the two diffuser panels 24, 24. Then, the first monomer vapor 37a and the second monomer vapor 37b are guided to a surface of the substrate 12, which is unwound from the roll 94, and are polymerized thereon to generate a polymer. Therefore, an organic polymer thin film formed of the polymer is formed on a surface of the substrate 12 by the vacuum deposition polymerization. Further, herein, the substrate 12 is continuously unwound from the roll 94, while the first and second monomer vapors 37a, 37b, are continuously introduced into the deposition chamber 10. Accordingly, by the vacuum deposition polymerization, the film forming operation for forming an organic polymer thin film on a surface of the substrate 12 is continuously performed.

Meanwhile, when the value detected by the monomer vapor pressure sensors 40a, 40b reached the predetermined value by the evaporation of the first and second monomer liquids 35a, 35b and the above film forming operation is started, concurrently with this, under control of the controller, which is not shown, the open/close valve 78 provided on the nozzle 76 of the hydraulic cylinder 74 of each of the monomer supply mechanisms 72, 72 is opened and retraction of the piston rod 80 of the hydraulic cylinder 74 at a constant speed is started.

Accordingly, during the film formation, the first and second monomer liquids 35a, 35b are, respectively, supplied into the first and second liquid-storage chambers 66a, 66b of the first and second evaporation source containers 64a, 64b from the hydraulic cylinders 74, 74 of the monomer supply mechanisms 72, 72, in a constant amount. This operation is continued until the film formation is finished. The amount of the first and second monomer liquids 35a, 35b herein is equal to the amount of the first and second monomer liquids 35a, 35b that is reduced by the evaporation in the first and second liquid-storage chambers 66a, 66b per unit time. The amount of the first and second monomer liquids 35a, 35b is suitably determined based on the results of the preliminary test or experience, for example.

As described above, in the apparatus for forming an organic polymer thin film of the present invention, from beginning of the film formation by vacuum deposition polymerization to end thereof, the first and second monomer liquids 35a, 35b are always contained in the first and second liquid-storage chambers 66a, 66b, respectively, in the constant amount.

In the organic polymer thin film formation on a surface of the substrate 12 having a longitudinal shape by this continuous process, when the amount of the first and second monomer liquids 35a, 35b in the hydraulic cylinders 74, 74 of the respective monomer supply mechanisms 72, 72 is reduced, the first and second monomer liquids 35a, 35b in the storage tank 84 are supplied to the respective hydraulic cylinders 74, 74 by opening the valve 86 for supplying first monomer provided on the communication pipe 82.

Therefore, when the film is continuously formed by vacuum vapor deposition process, by using the apparatus for forming an organic polymer thin film of the present invention, the amount of the first and second monomer liquids 35a, 35b in the first and second liquid-storage chambers 66a, 66b can be always maintained from beginning to end of the film formation. Thus, without a special control in the continuous film formation, the evaporated amount of the first and second monomer liquids 35a, 35b per unit time is always constant, depending on predetermined heating temperatures of the heaters 33a, 33b.

Thus, in the apparatus for forming an organic polymer thin film of the present embodiment, in the continuous film formation, even if the first and second monomer liquids 35a, 35b have low reactivity, for example, the first and second monomer liquids 35a, 35b each can be stably introduced into the deposition chamber 10 in a necessary amount. Therefore, a monomer proportion on the surface of the substrate 12 can readily and surely be stoichiometric proportion.

Further, in the apparatus for forming an organic polymer thin film of this embodiment, like the apparatus for forming an organic polymer thin film of the first and second embodiments, the internal pressures of the first and second vapor-storage chambers 68a, 68b of the first and second evaporation source containers 64a, 64b are made the highest, the internal, pressures of the monomer inlet pipes 26a, 26b are made the second highest, and the internal pressure of the deposition chamber 10 is made the lowest. As a result, during the film forming operation, the first and second monomer vapors 37a, 37b can be introduced into the deposition chamber 10 extremely stably and smoothly from the first and second vapor-storage chambers 68a, 68b.

Thus, by using the apparatus for forming an organic polymer thin film of this embodiment, high efficiency of film formation can be achieved. Further, an organic polymer thin film of the same quality having a predetermined composition and constant thickness can be always formed on a surface of the substrate 12, which is continuously unwound from the roll 94, with excellent reproducibility and stability, in the deposition chamber 10, regardless of the reactivity of the first and second monomer vapors 37a, 37b.

Although the third embodiment includes the mechanism which fills the storage tank 84 with the inert gas 62, it may be omitted. In that case, the storage tank 84 is constituted by an open container as shown in FIG. 11, for example. Then, the monomer supply tube 46 and the valve for second monomer supply 88 provided thereon, the inert gas supply tube 48 and the gas pressure control valve 52 provided thereon, the storage tank pressure sensor 58, the monomer throwing hopper 54, and the inert gas canister 56 may be all omitted (see, FIG. 10). Therefore, the structure of the monomer supply mechanism 72 may be effectively simplified.

While the specific embodiment of the present invention has been described in detail, for illustrative purpose only, it is to be understood that the present invention is not limited to the details of the illustrated embodiments.

For example, in the first and second embodiments, before the first and second monomer liquids 35a, 35b are evaporated in the repeated film formation, the first and second monomer liquids 35a, 35b are suctioned and automatically supplied into the first and second liquid-storage chambers 36a, 36b from the storage tanks 44, 44 based on the differences in the internal pressure between the first and second liquid-storage chambers 36a, 36b and the storage tanks 44, 44. However, the first and second monomer liquids 35a, 35b may be supplied into the first and second liquid-storage chambers 36a, 36b from the storage tanks 44, 44 by known actuator such as a pump, for example. Alternatively, the first and second monomer liquids 35a, 35b may be supplied into the first and second liquid-storage chambers 36a, 36b by human work, without using the actuator or the like.

Further, in the apparatus for forming an organic polymer thin film of the third and fourth embodiments, the roll 94 of the substrate 12 having a longitudinal shape is disposed in the deposition chamber 10, and an organic polymer thin film is continuously formed on a surface of the substrate 12, which is unwound from the roll 94. However, instead of the roll 94, a plurality of substrates 12 having a plate shape, which are disposed in the deposition chamber 10 of the apparatus for forming an organic polymer thin film of the first and second embodiments, may be alternately disposed to continuously perform a film forming operation. When the film is formed in such a way, from beginning to end of film forming operation on a surface of one of the substrates 12, the first and second monomer liquids 35a, 35b can be always present in the first and second evaporation source containers 64a, 64b in a constant amount. Thus, an organic polymer thin film having a predetermined composition and thickness can be formed on the surface of the plurality of substrates 12 stably with good reproducibility.

In the third and fourth embodiments, the hydraulic cylinders 74, 74 are used to supply the first monomer liquid 35a and the second monomer liquid 35b, respectively, in a constant amount into the first liquid-storage chamber 66a and the second liquid-storage chamber 66b. However, instead of the hydraulic cylinder 74, various kinds of known supply mechanisms may be suitably employed.

In order that the monomer is always present in a constant amount in a liquid form from beginning to end of the vacuum deposition polymerization, the monomer liquids 35a, 35b may be, respectively, supplied into the evaporation source containers 64a, 64b intermittently, instead of supplying the monomer liquids 35a, 35b, respectively, into the evaporation source containers 64a, 64b regularly and continuously in a constant amount as described in the third and fourth embodiments. Specifically, the monomer liquids 35a, 35b may be supplied to the respective evaporation source containers 64a, 64b in a predetermined amount only when a sensor provided in each of the evaporation source containers 64a, 64b for detecting the amount of the monomer liquids 35a, 35b in the evaporation source containers 64a, 64b detected a predetermined value.

In the above first to fourth embodiments, two kinds of monomers, i.e., the first monomer liquid 35a and the second monomer liquid 35b, are used. However, three or more kinds of monomers may be used. In that case, the same number of the monomer inlet pipes, the evaporation source containers, and the raw material supply mechanisms as the number of kinds of the monomers to be used should be provided in the apparatus.

Further, in the above first to fourth embodiments, the evaporation source containers 32a, 32b, 64a, and 64b are disposed outside the deposition chamber 10 and connected to the deposition chamber 10 via the monomer inlet pipes 26a, 26b. However, the evaporation source containers may be disposed in the deposition chamber.

Although further details will not be described herein, it is to be understood that the present invention may be embodied with various other changes and modifications which may occur to those skilled in the art, without departing from the spirit and scope of the invention.

EXAMPLES

To further clarify the present invention, a representative example of the invention will be described. It is to be understood that the invention is not limited to the details of the illustrated example and the foregoing description, but may be embodied with various changes, modifications and improvements, which may occur to those skilled in the art without departing from the scope of the invention.

Example 1

Initially, as monomers, two kinds of monomers, i.e., 1,3-bis(isocyanatemethyl)cyclohexane and methylenebis(4-cyclohexylamine), in a liquid form were each provided in a predetermined amount. Further, as an apparatus for forming an organic polymer thin film, an apparatus having a structure shown in FIG. 1 was provided. Specifically, the apparatus for forming an organic polymer thin film used herein includes a deposition chamber having a volume of 0.10 m$^3$, a mixing chamber having a volume of 0.01 m$^3$, and a first and second evaporation source containers, respectively, including a first and second vapor-storage chambers having a volume of 150 ml and first and second liquid-storage chambers having a volume of 100 ml.

Then, 100 ml of 1,3-bis(isocyanatemethyl)cyclohexane, which is the same volume as that of the first liquid-storage chamber, was contained in the first liquid-storage chamber, and 100 ml of methylenebis(4-cyclohexylamine), which is the same volume as that of the second liquid-storage chamber, was contained in the second liquid-storage chamber.

Then, film forming operation in which an aliphatic polyurea film is formed on a surface of a substrate disposed in the deposition chamber by the vacuum deposition polymerization was performed for 5 minutes, while vapor pressure of the monomer before the film formation was controlled to be 10 Pa, the monomer inlet-side pressure during the film formation was controlled to be 5 Pa, pressure in the deposition chamber before the film formation was controlled to be $2.0 \times 10^{-2}$ Pa, and pressure in the deposition chamber during the film formation was controlled to be $8.0 \times 10^{-1}$ Pa. This film forming operation for 5 minutes was repeated 20 times (20 batches) under the same condition, thereby forming the aliphatic polyurea film on the respective surfaces of 20 substrates which were alternately disposed in the deposition chamber. Further, in the repeated film forming operations, the monomers were each supplied into the first and second liquid-storage chambers, in the amount corresponding to the amount thereof used in the previous film forming operation, by the monomer supply mechanism, such that, at the beginning of the evaporation operation of 1,3-bis(isocyanatemethyl)cyclohexane and methylenebis(4-cyclohexylamine), each of the monomers was contained in each of the first and second liquid-storage chambers in the amount of 100 ml in a liquid form.

Then, thickness, appearance, and composition ratio of each of the aliphatic polyurea films, which was formed by the film forming operation performed 20 times on 20 substrates, were examined. The results are shown in Table 1 below. The thickness of the aliphatic polyurea film was measured by a film thickness measurement system utilizing spectral interference (USB2000 available from Ocean Optics, Inc.). The appearance of the aliphatic polyurea film was visually examined. Further, the composition ratio of the aliphatic polyurea film was calculated based on the results measured by total reflection method utilizing FT-IR spectrometer (NEXUS470 available from Thermo Electron Corporation). Here, "a:b" in Table 1 denotes "monomer a (1,3-bis(isocyanatemethyl)cyclohexane):monomer b (methylenebis(4-cyclohexylamine)". Table 1 only shows thickness, appearance, and composition ratio of the aliphatic polyurea films formed in the first batch, fifth batch, tenth batch, fifteenth batch, and twentieth batch.

Figure 12:
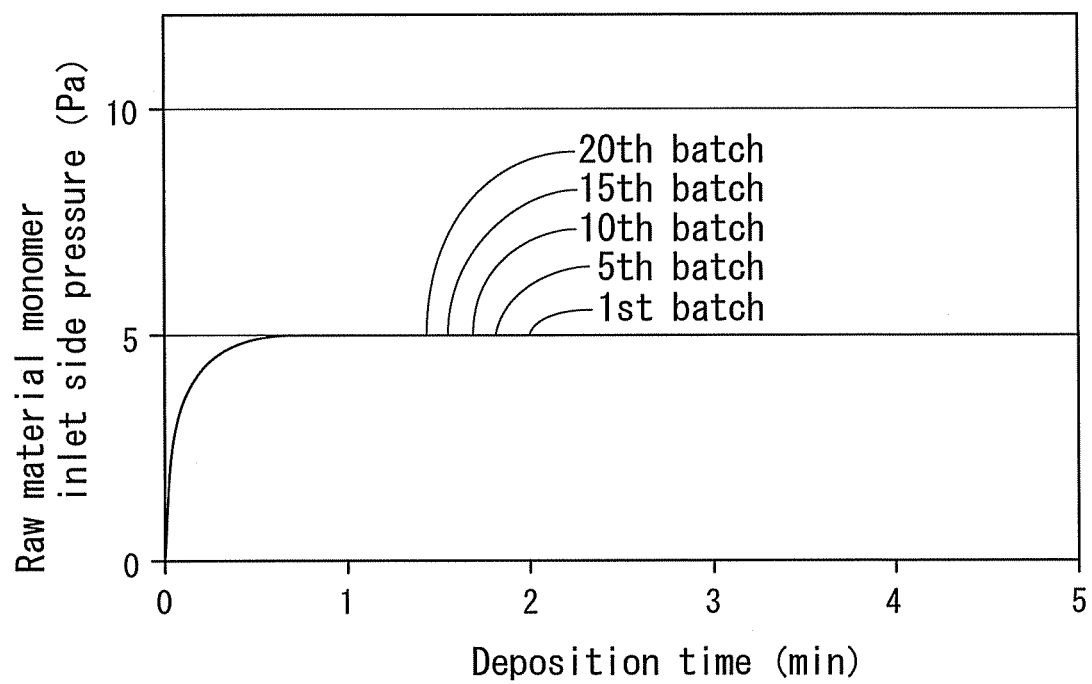
FIG. 12 is a graph showing changes in the monomer inlet-side pressure with the passage of time, at the formation of the organic polymer thin films on the surfaces of the plurality of substrates by repeatedly performing film forming operations according to the present invention, the changes being shown at predetermined numbers of the repeated film forming operations.

In each of the film forming operations which was repeated 20 times, changes in the monomer inlet-side pressure with the passage of time, which corresponds to the amount of the monomer introduced into the deposition chamber during the film formation (deposition), was examined every time. As the representative example thereof, changes in the monomer inlet-side pressure with the passage of time in the first batch, fifth batch, tenth batch, fifteenth batch and twentieth batch of 1,3-bis(isocyanatemethyl)cyclohexane is shown in FIG. 12.

Comparative Example 1

For comparison, as monomers, 1,3-bis(isocyanatemethyl)cyclohexane and methylenebis(4-cyclohexylamine) were each provided in a liquid form in a predetermined amount, and a conventional apparatus for forming an organic polymer thin film that does not include a monomer supply mechanism was provided. The apparatus for forming an organic polymer thin film used herein includes a deposition chamber having a volume of 0.10 $m^3$, a mixing chamber having a volume of 0.01 $m^3$, and first and second evaporation source containers each having a volume of 250 ml.

Then, 100 ml of 1,3-bis(isocyanatemethyl)cyclohexane and 100 ml of methylenebis(4-cyclohexylamine) were contained in the first evaporation source container and the second evaporation source container, respectively. Thereafter, the film forming operation in which an aliphatic polyurea film is formed on a surface of a substrate disposed in the deposition chamber by the vacuum deposition polymerization was performed for 5 minutes, while pressure was controlled as in Example 1. This film operation for 5 minutes was repeated 20 times (20 batches) under the same condition, thereby forming the aliphatic polyurea film on the respective surfaces of 20 substrates which were disposed in the deposition chamber in turn. Unlike Example 1, the first and second evaporation source containers were not refilled with the monomers every time after one film forming operation was performed.

Figure 13:
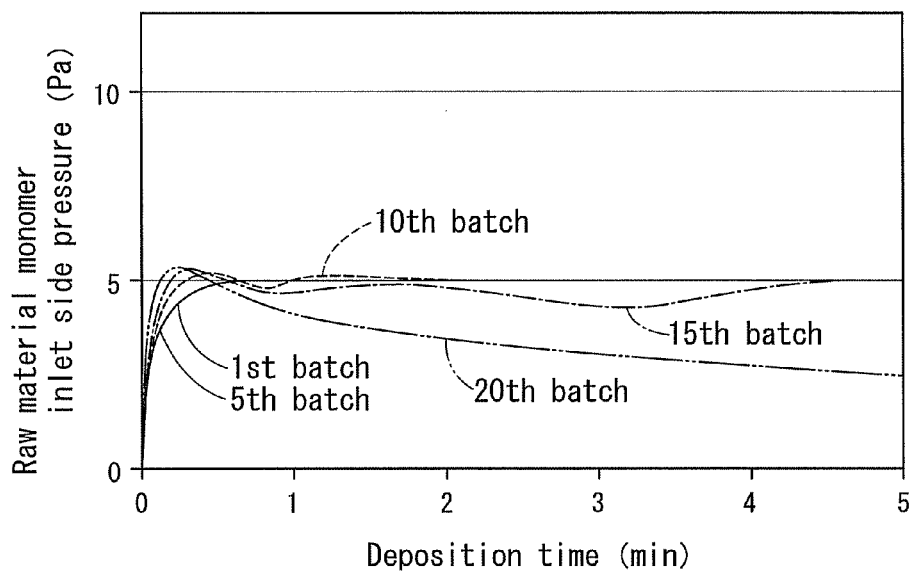
FIG. 13 is a graph showing changes in the monomer inlet-side pressure with the passage of time, at the time of formation of the organic polymer thin films on the surfaces of the plurality of substrates by repeated film forming operations under a predetermined pressure control according to the conventional invention, the changes being shown at predetermined numbers of the repeated film forming operations.

Thickness, appearance and composition ratio of the aliphatic polyurea films formed on the surfaces of 20 substrates by the film forming operations of 20 times were examined as Example 1. The results thereof are shown in the following Table 1. Further, in the repeated film forming operations of 20 times, changes in the monomer inlet-side pressure with the passage of time were examined every time. As the representative example thereof, changes in the monomer inlet-side pressure with the passage of time in the first batch, fifth batch, tenth batch, fifteenth batch and twentieth batch of 1,3-bis(isocyanatemethyl)cyclohexane are shown in FIG. 13.

Comparative Example 2

For further comparison, a predetermined amount of each of 1,3-bis(isocyanatemethyl)cyclohexane and methylenebis(4-cyclohexylamine), which were used as the monomers in Example 1 and Comparative Example 1, and the apparatus for forming an organic polymer thin film used in Comparative Example 1, were provided.

Then, 100 ml of 1,3-bis(isocyanatemethyl)cyclohexane and 100 ml of methylenebis(4-cyclohexylamine) were contained in the first evaporation container and the second evaporation container, respectively. Thereafter, on a surface of a substrate disposed in the deposition chamber, the film forming operation for forming an aliphatic polyurea film by vacuum deposition polymerization was performed for 5 minutes, without controlling the pressure as in Example 1 and Comparative Example 1. This film forming operation for 5 minutes was repeated 20 times (20 batches) under the same condition, thereby forming the aliphatic polyurea film on the respective surfaces of 20 substrates which were disposed in the deposition chamber in turn. Like Comparative Example 1, the first and second evaporation source containers were not refilled with the monomer every time after one film forming operation was performed. The vapor pressure of the monomer before film formation and the internal pressure of the deposition chamber same as those of Example 1 and Comparative Example 1 were employed.

Figure 14:
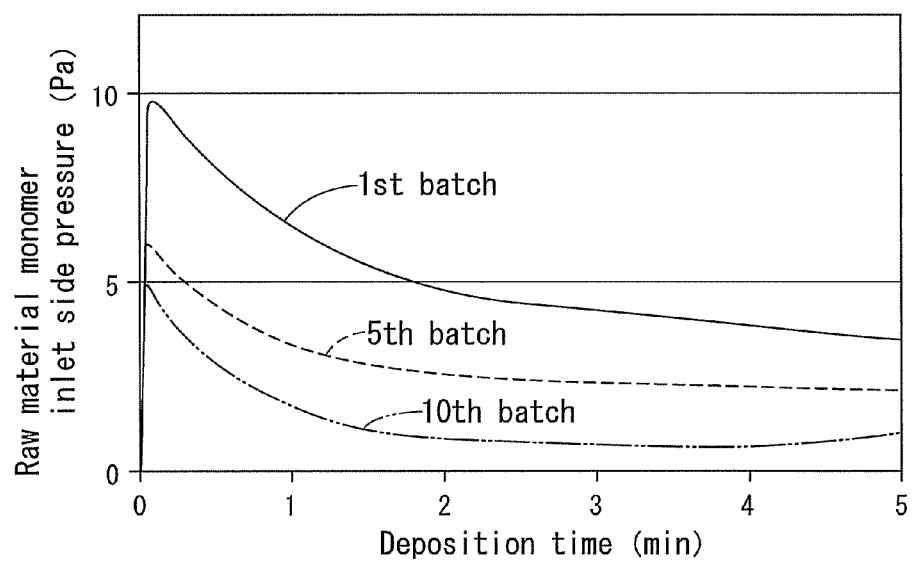
FIG. 14 is a graph showing changes in monomer inlet-side pressure with the passage of time, at the time of formation of the organic polymer thin films on the surfaces of the plurality of substrates by repeated film forming operations without a pressure control according to the conventional invention, the changes being shown at predetermined numbers of the repeated film forming operations.
Figure 15:
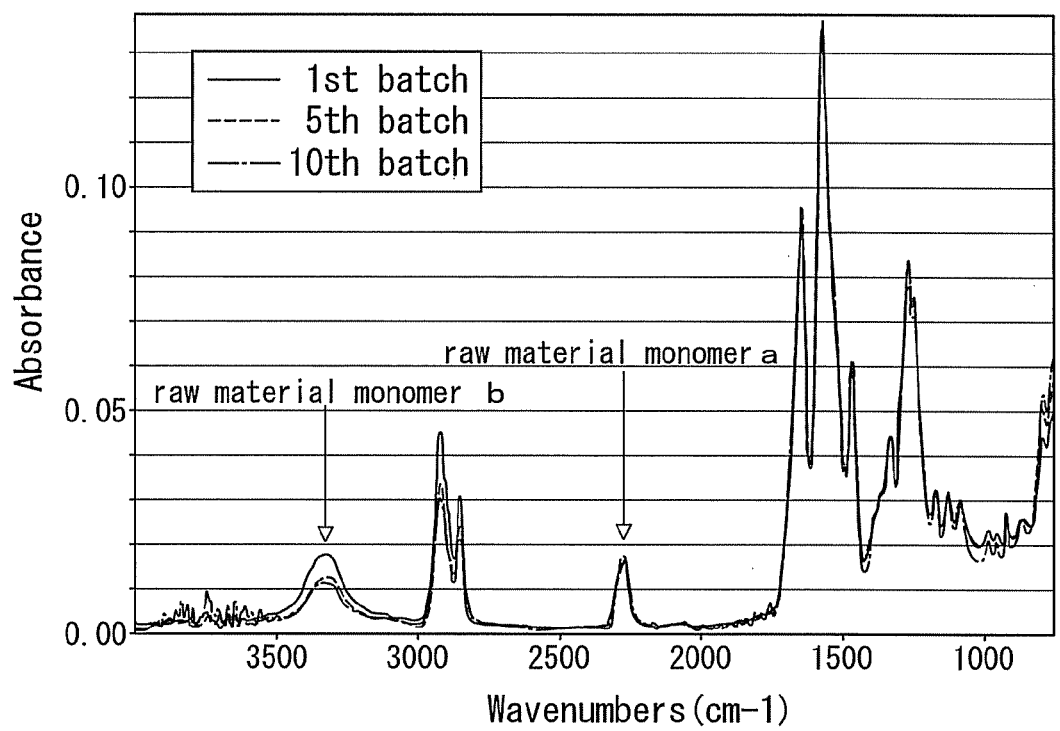
FIG. 15 is a graph showing infrared absorption spectrum of each of the organic polymer thin films formed on the surfaces of the plurality of substrates, which are obtained by repeatedly performing a film forming operation without controlling the pressure, according to the conventional method.

Thickness, appearance and composition ratio of the aliphatic polyurea films formed on the surfaces of 20 substrates by the film forming operations of 20 times were examined as Example 1. The results thereof are shown in the following Table 1. Further, in the repeated film forming operations of 20 times, changes in the monomer inlet-side pressure with the passage of time were examined every time. As representatives, changes in the monomer inlet-side pressure with the passage of time in the first batch, fifth batch, and tenth batch of 1,3-bis(isocyanatemethyl)cyclohexane are shown in FIG. 14. Further, infrared absorption spectrum of the aliphatic polyurea film formed in the first batch, fifth batch, and tenth batch is shown in FIG. 15. In FIG. 15, "the monomer a" denotes 1,3-bis(isocyanatemethyl)cyclohexane and "the monomer b" denotes methylenebis(4-cyclohexylamine).

TABLE 1

| | Batch number | Thickness (μm) | Appearance | Composition ratio a:b |
|---|---|---|---|---|
| Example 1 | 1st batch | 30 | normal | 1:1 |
| | 5th batch | 30 | normal | 1:1 |
| | 10th batch | 30 | normal | 1:1 |
| | 15th batch | 30 | normal | 1:1 |
| | 20th batch | 30 | normal | 1:1 |
| Comparative Example 1 | 1st batch | 30 | normal | 1:1 |
| | 5th batch | 30 | normal | 1:1 |
| | 10th batch | 29 | normal | 1:0.97 |
| | 15th batch | 26 | film defect | 1:0.86 |
| | 20th batch | 15 | film defect | 1:0.73 |
| Comparative Example 2 | 1st batch | 21 | normal | 1:1 |
| | 5th batch | 8 | film defect | 1:0.75 |
| | 10th batch | 3 | film defect/opaque | 1:0.59 |
| | 15th batch | | film was not formed | |
| | 20th batch | | film was not formed | |

As apparent from FIG. 12, the monomer inlet-side pressure was maintained in a constant value from the first batch through the twentieth batch in Example 1 in which the film forming operation was repeatedly performed by the apparatus for forming an organic polymer thin film having a structure according to the present invention. This clearly shows that the amount of the monomers introduced into the deposition chamber in one film forming operation can be maintained in a constant value regardless how many times the film forming operation was performed. Further, as apparent from Table 1, in Example 1, all aliphatic polyurea films formed on the surfaces of the substrates from the first batch through the twentieth batch have not only excellent appearance, but also constant thickness of 30 μm. In addition, no variation in composition ratio was found. From these results, it can be clearly confirmed that an organic polymer thin film having excellent quality and constant thickness can be stably formed on surfaces of substrates with excellent reproducibility by repeatedly performing the film forming operation according to the present method using the apparatus for forming an organic polymer thin film having a structure according to the present invention.

Compared to the above, as apparent from FIG. 13 and FIG. 14, in Comparative Examples 1 and 2 in which the film forming operation was repeatedly performed by the conventional method using the conventional apparatus, along with increase in times of the film forming operation, changes in the monomer inlet-side pressure with the passage of time during the film formation are gradually increased. This shows that the amount of the monomer introduced into the deposition chamber in one film forming operation is gradually largely varied. Further, as apparent from Table 1, in Comparative Examples 1 and 2 in which film forming operation was repeatedly performed by the conventional method using the conventional apparatus, not only the appearance of the aliphatic polyurea film was deteriorated, but also thickness thereof was gradually decreased, and further, the composition ratio thereof was varied a lot as the repeat times of the film forming operation was increased. Further, as shown in FIG. 15, in Comparative Example 2, as the repeat time of the film forming operation was increased, it is confirmed that the aliphatic polyurea film is changed to be rich in 1,3-bis(isocyanatemethyl)cyclohexane (the monomer a). From these results, it can be clearly recognized that the reproducibility of the organic polymer thin film to be formed on surfaces of a plurality of substrates cannot be obtained, when the film forming operation is repeatedly performed by the conventional method using the conventional apparatus.

What is claimed is:

1. A method of forming an organic polymer thin film, comprising the steps of: performing an evaporation operation of a plurality of kinds of monomers in a plurality of evaporation source containers in a vacuum state; and introducing the evaporated plurality of kinds of monomers into a deposition chamber in a vacuum state so as to be polymerized on a surface of at least one substrate disposed in the deposition chamber, thereby performing a vacuum deposition polymerization which is a forming operation of an organic polymer thin film on the surface of the at least one substrate, wherein each of the plurality of kinds of monomers is introduced into the deposition chamber due to a difference between pressures within each of the plurality of evaporation source containers and the deposition chamber, wherein only the evaporated plurality of kinds of monomers are introduced into the deposition chamber, wherein each of the plurality of kinds of monomers is present in its evaporation source container of the plurality of evaporation source containers each in a constant amount in a liquid form at least at a beginning of the evaporation operation of the monomers, wherein the plurality of evaporation source containers and the deposition chamber are connected via control valves, which are opened and closed such that internal pressures in the plurality of evaporation source containers are controlled to be higher than an internal pressure of the deposition chamber, wherein gate valves are provided in each of the plurality of evaporation source containers, each of the plurality of evaporation source containers are filled with a monomer of the plurality of kinds of monomers while the gate valves are closed, and then the plurality of evaporation source containers are heated so that the plurality of kinds of monomers are evaporated while the gate valves are opened and the control valves are closed until internal pressures within the evaporation source containers reach predetermined values, then the control valves are opened to introduce the evaporated plurality of kinds of monomers into the deposition chamber, wherein each evaporation source container is a pressure-tight container that is heremetically sealed with a gate valve partitioning the evaporation source container into an upper portion and a lower portion, wherein the lower portion is a liquid storage chamber and the upper portion is a vapor storage chamber with the gate valve therebetween in the evaporation source container, the upper portion connected to the deposition chamber by a single control valve, and each evaporation source container includes a monomer supply mechanism to supply the monomer to the liquid storage chamber of each evaporation source container, wherein each monomer supply mechanism comprises a heremetically sealed storage tank, an inert gas supply with an inert gas supply tube including an inert gas pressure control valve, connected between the inert gas supply and the storage tank, and a monomer suction tube in communication with a lower portion of the storage tank and the respective liquid storage chamber of the evaporation source container for that monomer with a valve positioned between the liquid storage chamber and the storage tank, and wherein a space within the storage tank that is not filled with the monomer is filled with the inert gas at a pressure above atmospheric pressure, and when the control valve and the gate valve are closed and the monomer suction tube valve is opened, the monomer is automatically suctioned from the storage tank to the liquid storage chamber due to a difference in pressure.

2. The method of forming an organic polymer thin film according to claim 1, wherein the at least one substrate comprises a plurality of substrates and the vacuum deposition polymerization is repeatedly performed to form the organic polymer thin film on the surface of each of the plurality of substrates that is disposed in the deposition chamber in turn, and the plurality of kinds of monomers are present in the plurality of evaporation source containers each in a constant amount in a liquid form at the beginning of each of the evaporation operations of the monomers for the repeated vacuum deposition polymerization.

3. The method of forming an organic polymer thin film according to claim 2, wherein each of the plurality of kinds of monomers is intermittently supplied into each of the plurality of evaporation source containers in a liquid form, from the beginning of the evaporation operation of the monomers to end of the forming operation of the organic polymer thin film on a surface of the plurality of substrates, by an amount equal to the amount that is reduced due to the evaporation, thereby allowing the plurality of kinds of monomers in a liquid form to be present in the plurality of evaporation source containers always in a constant amount.

4. The method of forming an organic polymer thin film according to claim 1, the plurality of kinds of monomers are aliphatic diisocyanate and aliphatic diamine.

5. The method of forming an organic polymer thin film according to claim 1, wherein the organic polymer thin film is any one of an aliphatic polyurea film, an aliphatic polyamide film, a polyester film, and a polyurethane film.

* * * * *